(12) United States Patent
Kobaru et al.

(10) Patent No.: US 7,817,105 B2
(45) Date of Patent: *Oct. 19, 2010

(54) IMAGE FORMING METHOD AND CHARGED PARTICLE BEAM APPARATUS

(75) Inventors: Atsushi Kobaru, Hitachinaka (JP);
Hidetoshi Morokuma, Hitachinaka (JP);
Hiroki Kawada, Tsuchiura (JP); Sho Takami, Hitachinaka (JP); Katsuhiro Sasada, Hitachinaka (JP); Kouichi Yamamoto, Hitachinaka (JP); Norio Satou, Ibaraki (JP); Kunio Nakanishi, Kitaibaraki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 534 days.

This patent is subject to a terminal disclaimer.

(21) Appl. No.: 11/713,687

(22) Filed: Mar. 5, 2007

(65) Prior Publication Data

US 2007/0159662 A1 Jul. 12, 2007

Related U.S. Application Data

(63) Continuation of application No. 11/298,590, filed on Dec. 12, 2005, now Pat. No. 7,187,345.

(30) Foreign Application Priority Data

Jul. 29, 2005 (JP) ............... 2005-221185
Nov. 24, 2005 (JP) ............... 2005-338009

(51) Int. Cl.
*G09G 1/08* (2006.01)
*G21K 1/08* (2006.01)

(52) U.S. Cl. .......... 345/10; 250/310; 250/311; 250/396 R; 348/284; 348/325; 348/806

(58) Field of Classification Search ............. 345/10–29; 250/310, 311, 203.5, 396 R, 397–400; 348/284, 348/325, 806; 430/30, 296, 311, 313, 315

See application file for complete search history.

(56) References Cited

U.S. PATENT DOCUMENTS

| | | | |
|---|---|---|---|
| 4,057,722 A | 11/1977 | Hieke | |
| 5,204,531 A | 4/1993 | Elings et al. | |
| 5,302,828 A | 4/1994 | Monahan | |
| 5,412,209 A | 5/1995 | Otaka et al. | |
| 5,523,567 A | 6/1996 | Kawamata et al. | |
| 5,783,366 A * | 7/1998 | Chen et al. | 430/311 |
| 5,817,442 A * | 10/1998 | Okino | 430/30 |

(Continued)

FOREIGN PATENT DOCUMENTS

JP 5-151927 6/1993

(Continued)

*Primary Examiner*—Henry N Tran
(74) *Attorney, Agent, or Firm*—Antonelli, Terry, Stout & Kraus, LLP.

(57) ABSTRACT

An image forming method and a charged particle beam apparatus suitable for suppressing the inclination of charging when scanning a two-dimensional area with a charged particle beam. A third scanning line located between a first scanning line and a second scanning line is scanned. After the first, second and third scanning lines have been scanned, a plurality of scanning lines are scanned between the first and third scanning lines and between the second and third scanning lines.

19 Claims, 21 Drawing Sheets

U.S. PATENT DOCUMENTS

| | | |
|---|---|---|
| 6,608,305 B1 | 8/2003 | Kin et al. |
| 6,635,873 B1 | 10/2003 | Todokoro et al. |
| 6,667,476 B2 * | 12/2003 | Todokoro et al. ............... 850/9 |
| 6,744,058 B1 * | 6/2004 | Gau et al. .............. 250/492.22 |
| 6,835,937 B1 | 12/2004 | Muraki et al. |
| 7,223,974 B2 * | 5/2007 | Petrov et al. ................. 250/310 |
| 2002/0024478 A1 | 2/2002 | Saito et al. |
| 2005/0121610 A1 | 6/2005 | Abe |

FOREIGN PATENT DOCUMENTS

| | | |
|---|---|---|
| JP | 2000-200579 | 7/2000 |
| JP | 2005-142038 | 6/2005 |

* cited by examiner

FIG.16A

ARROW: RASTER DIRECTION

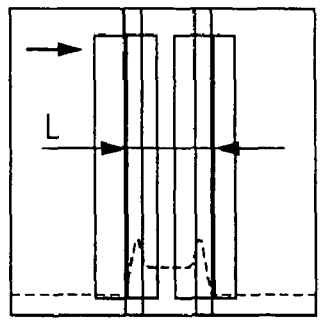

DOTTED LINE: SIGNAL PROFILE
THICK LINES: EDGE DETECTION POSITIONS

LENGTH MEASUREMENT AT
TIME OF RASTER ROTATION 0°

FIG.16B

ARROW: RASTER DIRECTION

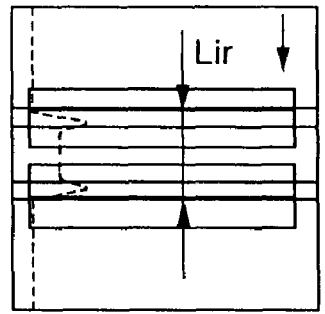

LENGTH MEASUREMENT CONDUCTED
WHEN IMAGE OBTAINED AT TIME OF
RASTER ROTATION 0° IS ROTATED BY 90°

FIG.16C

ARROW: RASTER DIRECTION

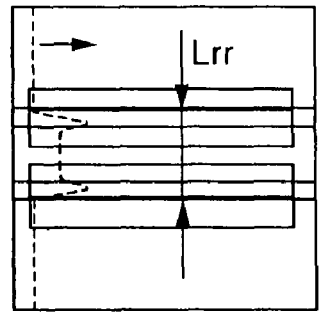

LENGTH MEASUREMENT AT
TIME OF RASTER ROTATION 90°

IN SCAN ACCORDING TO THE PRESENT INVENTION, L=LIR=LRR
IN CONVENTIONAL TV SCAN, L=LIR≠LRR

DOT-DASH LINE: SCAN RANGE AT TIME OF PRE-DOSING

SOLID LINE: SCAN RANGE AT TIME OF LENGTH MEASUREMENT

DOT-DASH LINE: CONVENTIONAL TV SCAN
SOLID LINE: PRESENT INVENTION SCAN

IMAGE FORMING METHOD AND CHARGED PARTICLE BEAM APPARATUS

CROSS REFERENCE TO RELATED APPLICATION

This application is a continuation of U.S. application Ser. No. 11/298,590, filed Dec. 12, 2005 now U.S. Pat. No. 7,187,345, which claims priority from Japanese patent application JP 2005-221185, filed Jul. 29, 2005 and JP 2005-338009, filed Nov. 24, 2005, the contents of which are incorporated herein by reference.

BACKGROUND OF THE INVENTION

The present invention relates to an image forming method using a charged particle beam, and a charged particle beam apparatus. In particular, the present invention relates to an image forming method and a charged particle beam apparatus capable of suppressing the influence of charging.

If an electron beam is applied to a sample, secondary electrons are generated. In scanning electron microscopes, an observed image on the surface of the sample is obtained using a phenomenon that the quantity of generation of secondary electrons changes depending upon the shape of the sample. In conventional scanning electron microscopes, scanning is conducted in the horizontal direction, i.e., in the raster direction in the screen every line (every horizontal line in the screen). The order of scanning lines is a descending order from the top to the bottom in the vertical direction in the screen.

In the scan scheme according to the conventional technique, raster scanning is conducted successively from the top to the bottom in the vertical direction in the screen. In the vertical direction, therefore, inclination is often generated in the charging phenomenon generated by electron beam radiation.

In other words, when a certain line is being scanned, charge remaining on a line already scanned immediately before affects the primary electron beam and the secondary electron beam in scanning, changes their trajectories, and distorts a finally obtained sample image.

In JP-A-2005-142038, it is described to reduce the influence of charging by conducting interlaced scanning using the charged particle beam.

SUMMARY OF THE INVENTION

According to the technique disclosed in JP-A-2005-142038, accumulation of charging can be mitigated to some degree by interlaced scanning. Since the time interval for forming neighboring scanning lines is not sufficient, however, there is a problem that the inclination of charging remains.

An object of the present invention is to provide an image forming method and a charged particle beam apparatus suitable for suppressing the inclination of charging when scanning a two-dimensional area with a charged particle beam.

According to a method, and apparatus, proposed by the present invention, a third scanning line located between a first scanning line and a second scanning line is scanned. After the first, second and third scanning lines have been scanned, a plurality of scanning lines are scanned between the first and third scanning lines and between the second and third scanning lines.

According to such a configuration, the first, second and third scanning lines have intervals including a plurality of scanning lines. Therefore, it becomes possible to prevent residual charging on one scanning line from affecting other scanning lines. In addition, while scanning a plurality of scanning lines between the first and third scanning lines and between the second and third scanning lines, it is possible to mitigate the charging. Over the scanning area, therefore, it is possible to mitigate the influence of the absolute charging and suppress the inclination thereof.

As an example of such a configuration, it is desirable to locate a fourth scanning line to be scanned after the scanning of the first, second and third scanning lines is located on a center line between the first and third scanning lines (positions at equal distances from the first and third scanning lines) or on a center line between the second and third scanning lines.

According to such a configuration, the fourth scanning line is located in a position in the scanning area that is least susceptible to the influence of the charging on the first, second and third scanning lines. Therefore, it becomes possible to effectively suppress the inclination of the charging.

Other configurations and specific examples of the present invention will be described in detail with reference to embodiments.

According to the present invention, it becomes possible to provide a method, and apparatus, for forming an image free from brightness inclination.

Other objects, features and advantages of the invention will become apparent from the following description of the embodiments of the invention taken in conjunction with the accompanying drawings.

BRIEF DESCRIPTION OF THE DRAWINGS

FIGS. 16A, 16B and 16C are diagrams showing examples in which length can be measured with high precision irrespective of the scanning direction;

DETAILED DESCRIPTION OF THE EMBODIMENTS

In embodiments described hereafter, the order of conducting raster scanning in the vertical direction in the screen is determined so as to always conducting scanning between two arbitrary lines scanned previously in order to prevent the sample image from being distorted by influence of local surface charging.

By doing so, it is possible to obtain a favorable image from a sample made of materials of two kinds described below. In other words, in the case of a material that leaves charging on already scanned lines for a long time, influences of previous scans are always balanced on a line that is being scanned, in the vertical direction and mitigated. This is because influences of charging on two previously scanned lines are canceled each other on a line located at equal distances from the lines. In the case of the other material, i.e., a material that causes charging on an already scanned line to disappear after a definite time, always taking a middle line between two previously scanned lines means always taking a statistical distant place that is least susceptible to any of a plurality of previously scanned in the past, at a definite time. Finally, it becomes possible to keep the distortion of the sample image caused by the influence of surface charging at a minimum.

First Embodiment

Figure 1:
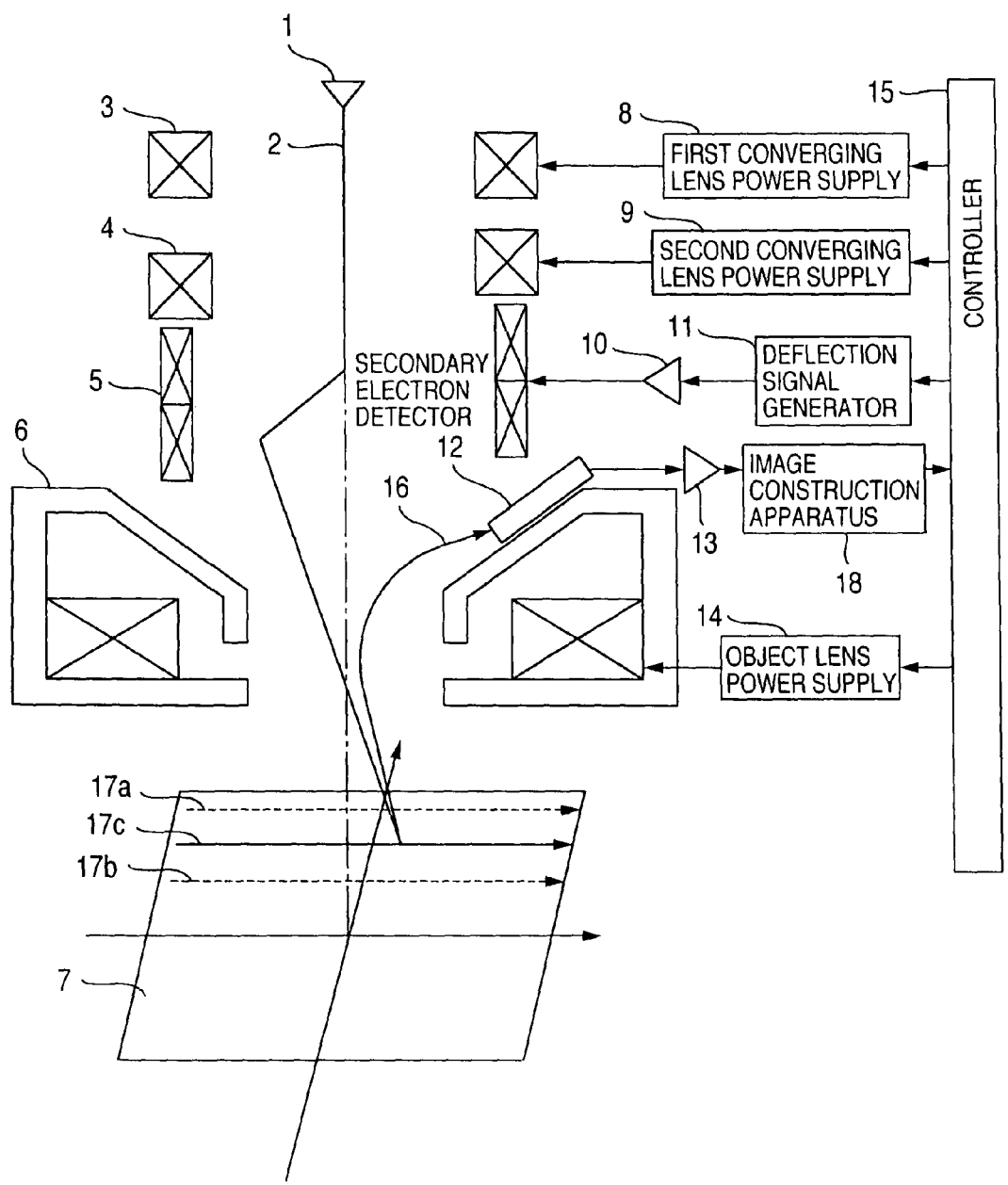
FIG. 1 is a schematic diagram of a scanning electron microscope.

Hereafter, a first embodiment of the present invention will be described with reference to the drawings. A first embodiment of the present invention is shown in FIG. 1. The present embodiment will now be described by taking a scanning electron microscope which conducts scanning with an electron beam and forms a two-dimensional image of the sample as an example. However, the present embodiment is not restricted to this. If the influence of charging cannot be neglected, it is also possible to apply the present embodiment to an FIB (Focused Ion Beam) apparatus, which conducts scanning with an ion beam and forms an SIM (Scanning Ion Microscope) image.

As shown in FIG. 1, the present embodiment includes an electron beam source 1, a first converging lens 3 and a second converging lens 4 for focusing a primary electron beam 2 emitted from the electron beam source 1, deflectors 5 for deflecting the primary electron beam 2 to scan a surface of a sample 7 with the primary electron beam 2, an object lens 6 for focusing the primary electron beam 2 onto a surface of the sample 7, a secondary electron detector 12 for detecting secondary electrons 16 generated after the primary electron beam 2 strikes against the surface of the sample 7, a first converging lens power supply 8 and a second converging lens power supply 9 respectively for driving the first converging lens 3 and the second converging lens 4, a deflection signal generator 11 for generating deflection signals so as to scan the surface of the sample 7 with the primary electron beam 2 in accordance with a predetermined method, deflector drivers 10 for driving the deflectors 5 in response to the deflection signal, an amplifier 13 for amplifying a secondary electron signal detected by the secondary electron detector 12, an image construction apparatus for generating an image on the basis of the amplified secondary electron signal, an object lens power supply 14 for driving the object lens 6 so as to focus the primary electron beam 2 in a predetermined position, and a controller 15 for controlling the components heretofore described.

If a line 17a on the sample 7 is first scanned with the primary electron beam 2, then a line 17b is scanned. Subsequently, a line 17c that is located at equal distances from the already scanned lines 17a and 17c is scanned.

Detailed operation of the deflection signal generator 11 and the image construction apparatus 18 will now be described with reference to FIG. 2. In the deflection signal generator 11, an address generation circuit 22 outputs an address indicating a position on the sample 7 to which the electron beam should be applied, in accordance with a clock output from a write clock output circuit 21. On the basis of the address, D/A converters 23 generate analog signals respectively corresponding to quantities by which the primary electron beam 2 should be deflected respectively in the horizontal direction and the vertical direction. In accordance with the analog signals, the deflector drivers 10 drive the deflectors 5.

The image construction apparatus 18 operates as described below. In other words, a secondary electron signal detected by the secondary electron detector 12 is amplified by the amplifier 13, and then converted to a digital signal by an A/D converter 24. This digital signal is stored in a memory group included in an illustrated image memory 26 via an input switch 25. The selected memory group is associated in one to one correspondence with a line indicated by an address that is generated by the address generation circuit 22. The deflection position of the primary electron beam generated by the address generation circuit 22 is controlled in accordance with a deflection pattern A shown in FIG. 3. Image data of lines sent from the image memory are not in the descending order in the vertical direction (perpendicular to the lines) in the observation area on the sample. The input switch 25 rearranges these image data in accordance with the deflection pattern A so as to arrange them in the descending order in the vertical direction in the image memory.

If images corresponding to a predetermined area on the sample 7 are obtained by repeating such a procedure, the image data stored in the image memory 26 is displayed in accordance with a procedure hereafter described. That is, a read address generation circuit 28 outputs an address, which indicates a position on a display device 33 on which drawing should be conducted, in accordance with a clock output from a read clock output circuit 27. On the basis of the address, D/A converters 29 generate analog signals corresponding to quantities by which the drawing electron beam generated in the display device 33 should be deflected respectively in the horizontal direction and the vertical direction. Deflection amplifiers 30 drives drive the deflectors within the display device 33 in accordance with the analog signals.

At this time, the image construction apparatus 18 operates as hereafter described. That is, in a state in which image data are already stored in the image memory 26, image data corresponding to one line is read out from a memory group in the image memory 26 indicated by an output switch 31 as a digital signal. The memory group selected here is associated in one-to-one correspondence with the line indicated by the address generated by the address generation circuit 28. A D/A converter 32 converts the digital signal read out to an analog signal, and supplies the analog signal to the display device 33. In the display device 33, luminance of the drawing electron beam generated from a cathode is changed in accordance with the analog signal. In addition, the drawing electron beam is deflected by the deflectors included in the display device 33 described earlier. As a result, an image is displayed.

Figure 4:
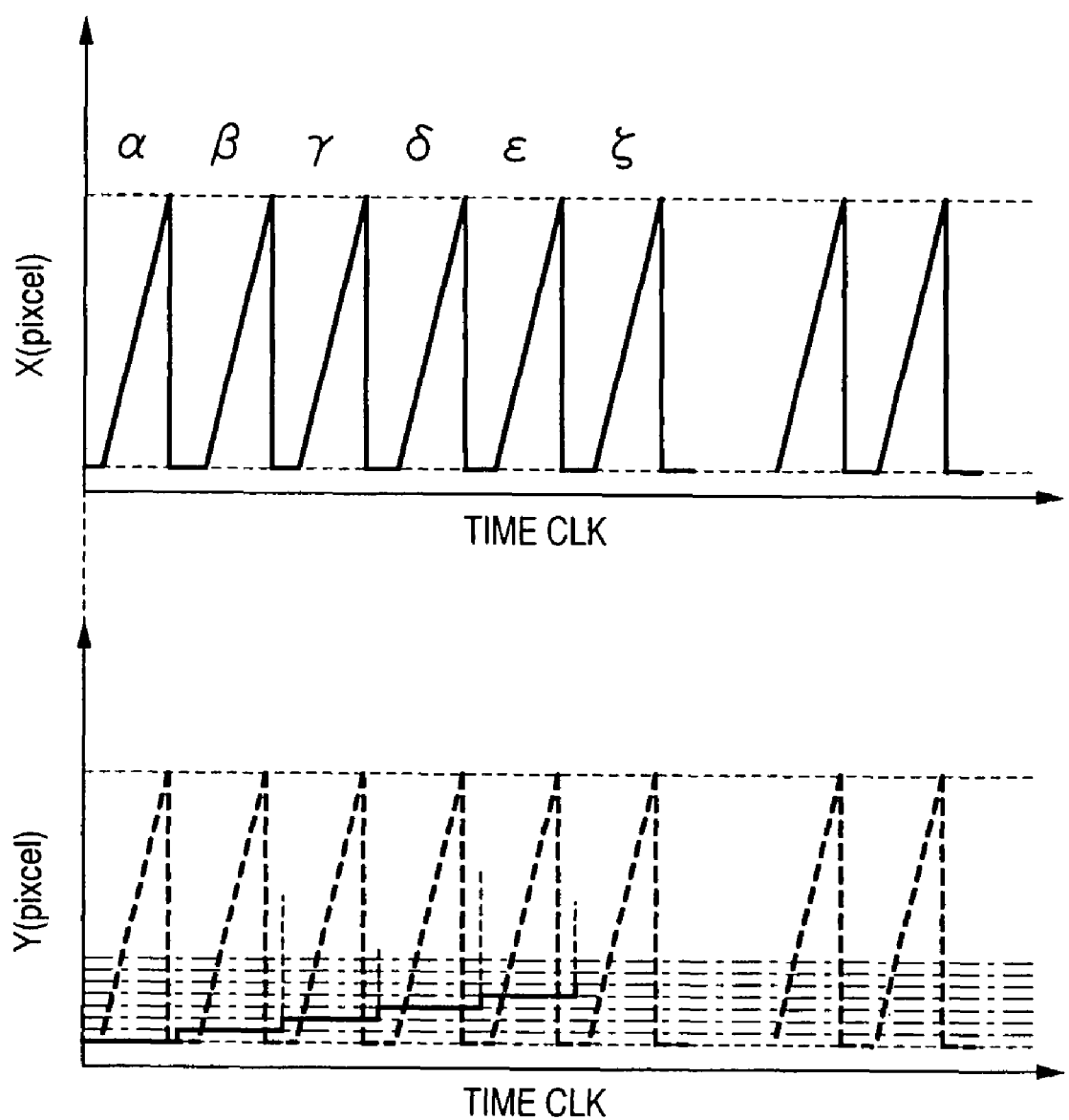
FIG. 4 is a diagram showing an example of a deflection pattern.

The position of drawing on the display device 33 which is generated by the read address generation circuit 28 is controlled in accordance with a deflection pattern B shown in FIG. 4. Therefore, image data of lines output from the image memory have a descending order in the vertical direction (perpendicular to the lines) in the observation area on the sample. The output switch 31 sends these image data in order in accordance with the same deflection pattern B. A scanning electron microscope image of the sample is displayed via these processes.

Figure 2:
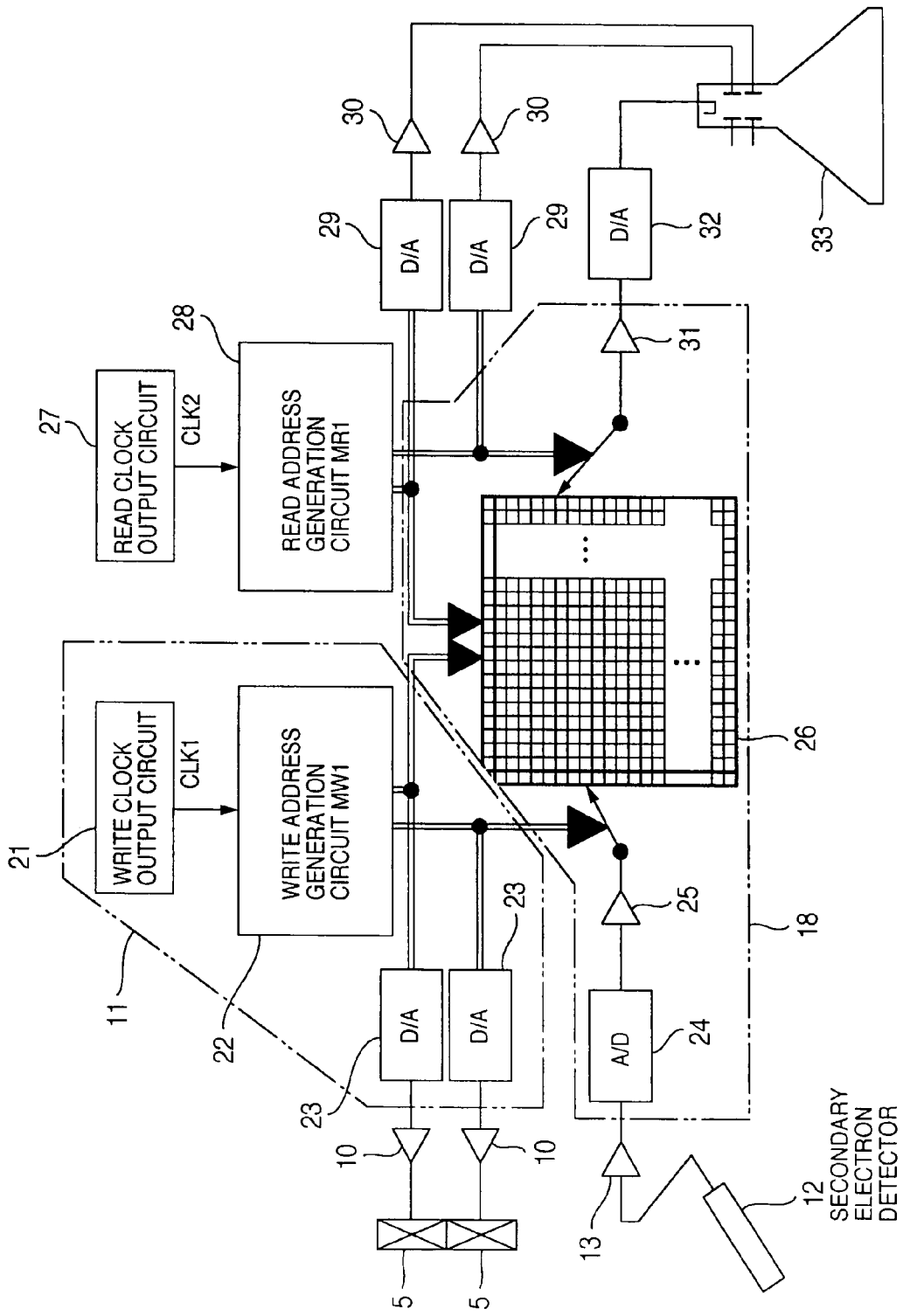
FIG. 2 is a diagram showing an example of an image memory in a scanning electron microscope.

Apart from FIG. 2, the image data stored in the image memory 26 are sent to the controller 15 and subject to appropriate processing to achieve the predetermined object.

Figure 3:
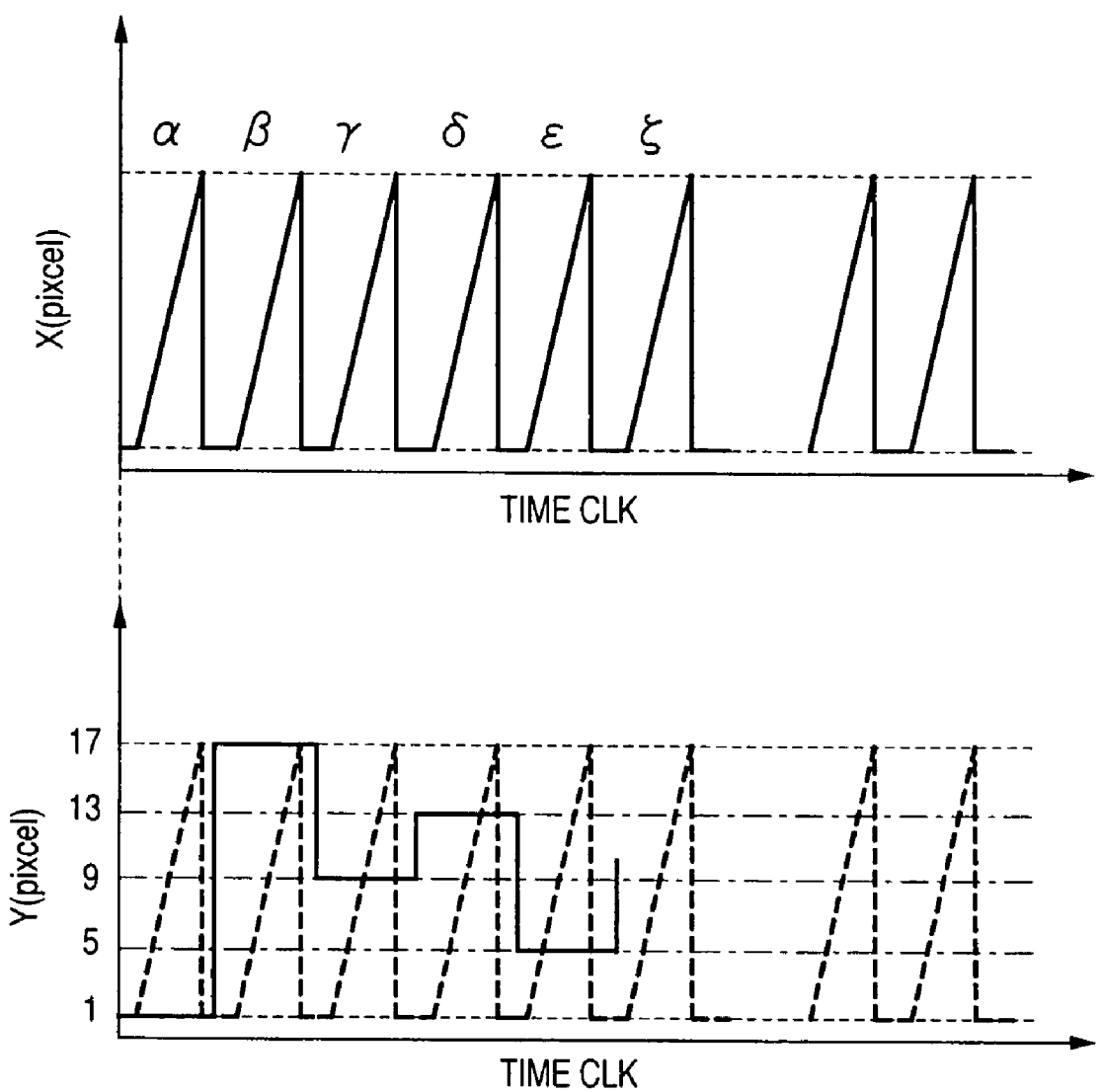
FIG. 3 is a diagram showing an example of a deflection pattern.

The deflection pattern A will now be described with reference to FIG. 3. In the scanning electron microscope according to the present invention, scanning is conducted in the horizontal X direction at definite periods in accordance with a sawtooth waveform. This is called raster scan. On the other hand, in the vertical Y direction, the scanning position is controlled in conformity with the periods of the raster scan. In the case of the deflection pattern A, a line located in a scanning line position "1" is scanned in a period α). A line located in a scanning line position "17" is scanned in a period β), and a line located in a scanning line position "9" is scanned in a period y). A line located in a scanning line position "13" is scanned in a period d), and a line located in a scanning line position "5" is scanned in a period ∈).

The deflection pattern B will now be described with reference to FIG. 4. In accordance with the deflection pattern B, the deflection of the primary electron beam is conducted in the same way as the conventional scanning electron microscope. Each time the period advances as represented by a)→b)→c)→d)→e), scanning is conducted on a line located in a position obtained by causing a stepwise movement with a predetermined interval corresponding to one line or two lines.

Figure 5:
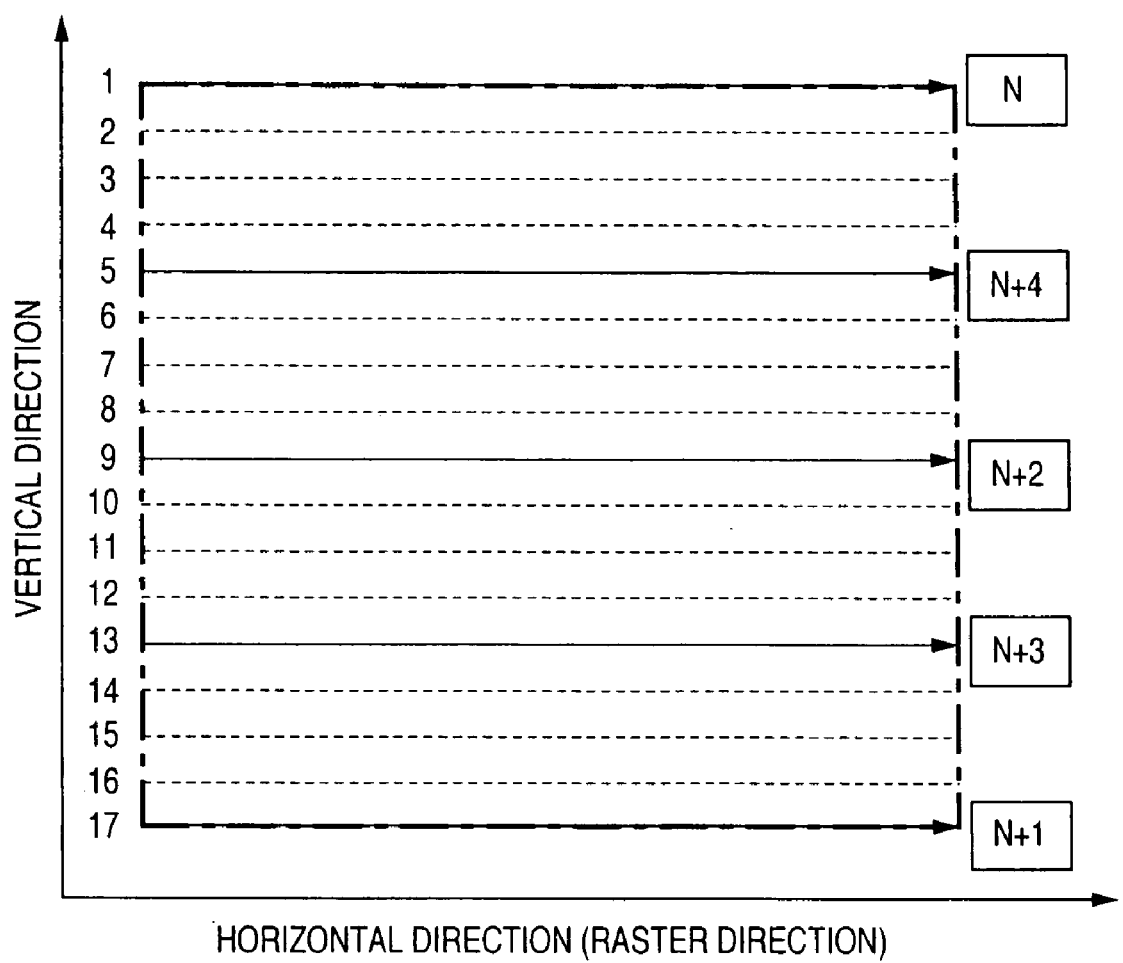
FIG. 5 is a diagram showing an example of a trajectory of a deflection pattern.

FIG. 5 shows an example of a trajectory obtained when the sample 7 is scanned with the primary electron line 2 in accordance with the deflection pattern A.

For example, in an arbitrary area formed by seventeen lines as shown in FIG. 5, an Nth scan, an (N+1)-st scan, an (N+2)-nd scan, an (N+3)-rd scan and an (N+4)-th scan are conducted on a line 1, a line 17, a line 9, a line 13 and a line 5, respectively. In other words, the (N+3)-rd scan is conducted on a center line in an area (having a first scanning line interval) prescribed by lines respectively associated with the (N+1)-st scan and the (N+2)-nd scan, and the (N+4)th scan is conducted on a center line in an area (having a first scanning line interval) prescribed by lines respectively associated with the Nth scan and the (N+2)-nd scan.

In intervals (having a second scanning line interval) between two of the lines "1," "5," "9," "13" and "17," a plurality of scanning lines still remain to be scanned. Therefore, it becomes possible to prevent the charging generated on each scanning line from affecting other scanning lines. Subsequently, any of lines "3," "7," "11" and "15" is scanned. This scan on the lines "3," "7," "11" and "15" corresponds to the following operation: after the scan on center lines between scanning lines having equal scanning line intervals (scans on the lines "5" and "13") has been finished, scan is newly conducted on scan lines having narrowed intervals from the already scanned scan lines (the lines "1," "5," "9," "13" and "17"). By thus repeating a process of subsequently conducing scanning on a scanning line located on a center line between already scanned lines, it becomes possible to suppress the inclination of charging. This effect becomes more remarkable when the number of scanning lines is large. When scanning M scanning lines, a line 1 is first scanned and a line M is secondly scanned, and then a line m located on a center line between the line 1 and the line M is thirdly scanned. (If M is even, a scanning line that is the closest to the center line between the line 1 and the line M is selected.)

Subsequently, the line 1 and the line m, or the line m and the line M are regarded as the original line 1 and line M, and a center line between them is scanned. By repeating such processing and conducting processing of gradually narrowing the interval between the line 1 and the line M, it is possible to sustain the effect of preventing the charging phenomenon of each scanning line from affecting other scanning lines for a long time.

Owing to the configuration heretofore described, it is possible to implement a scanning electron microscope capable of suppressing the inclination of the charging phenomenon caused in the direction perpendicular to the raster scan by scanning on the sample with the electron beam. In the case of the present example, a new scanning line is set in a position that is at the greatest distance from the already scanned position, and an interval between consecutive scanning lines is made equal to an interval corresponding to a plurality of scanning lines. As a result, it becomes possible to suppress the rise of the charging value over the entire scanning area, and it becomes possible to effectively prevent the inclination of the charging phenomenon. When scanning one frame or one area, finally a new scanning line is set in a position that is in close vicinity to an already scanned position. At that time, however, the charging state on the already scanned scanning line is mitigated to some degree. As a whole, therefore, it becomes possible to suppress the charging state.

Figure 6:
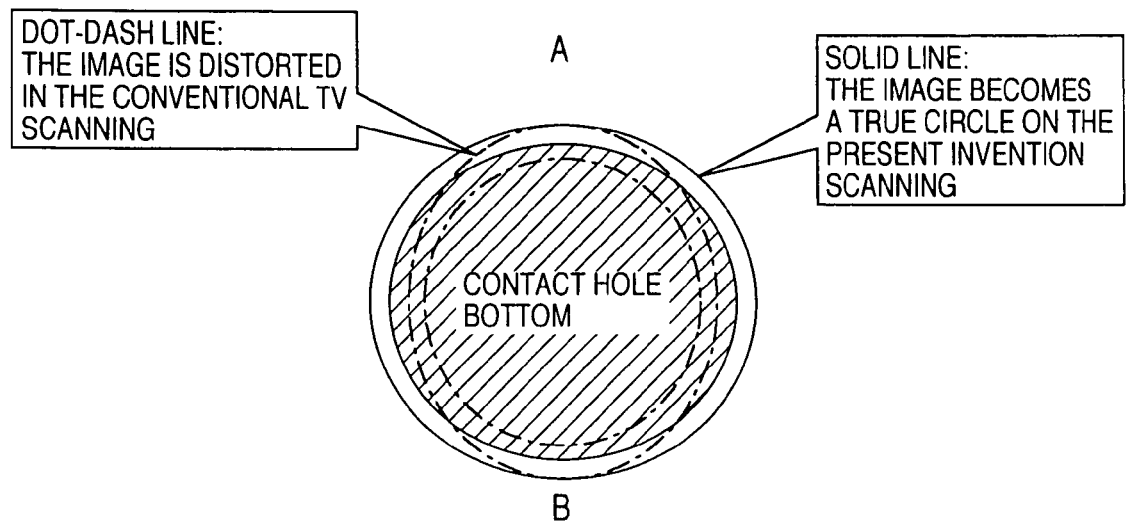
FIG. 6 is a diagram showing an observation example of a contact hole.
Figure 7:
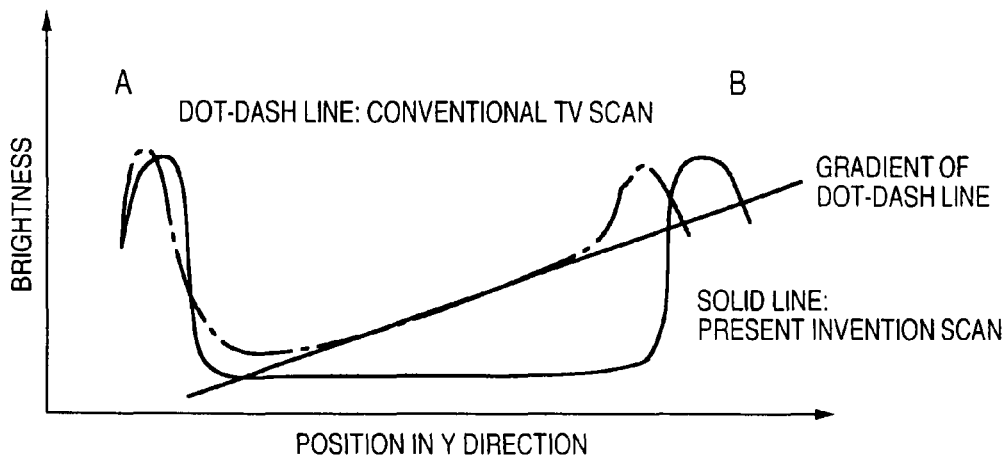
FIG. 7 is a diagram showing an example of a line profile obtained by conducting scanning on a contact hole.

An example of an effect obtained using the scanning electron microscope according to the present embodiment is shown in FIG. 6. If a hole formed by a specific material and called contact hole is observed using conventional TV scanning, an ellipse that is longer in the vertical direction is obtained as represented by a dot-dash line. By using the scanning method according to the present invention, however, it becomes possible to observe the contact hole in its original shape that is close to the real circle and shown by a solid line. A profile of the same contact hole image along a section A-B is shown in FIG. 7. In the image obtained using the conventional TV scanning and represented by the dot-dash line in FIG. 6, the profile is shown to be higher on a B side located on the bottom side in the vertical direction on the screen and scanned last as compared with an A side located on the top side and scanned first. This indicates that the image is displayed brightly on the B side as compared with the A side. In an image obtained by the scan method according to the present invention and represented by a solid line in FIG. 6, however, there is no inclination, i.e., there is no brightness difference on the profile between the A side and the B side.

Figure 8:
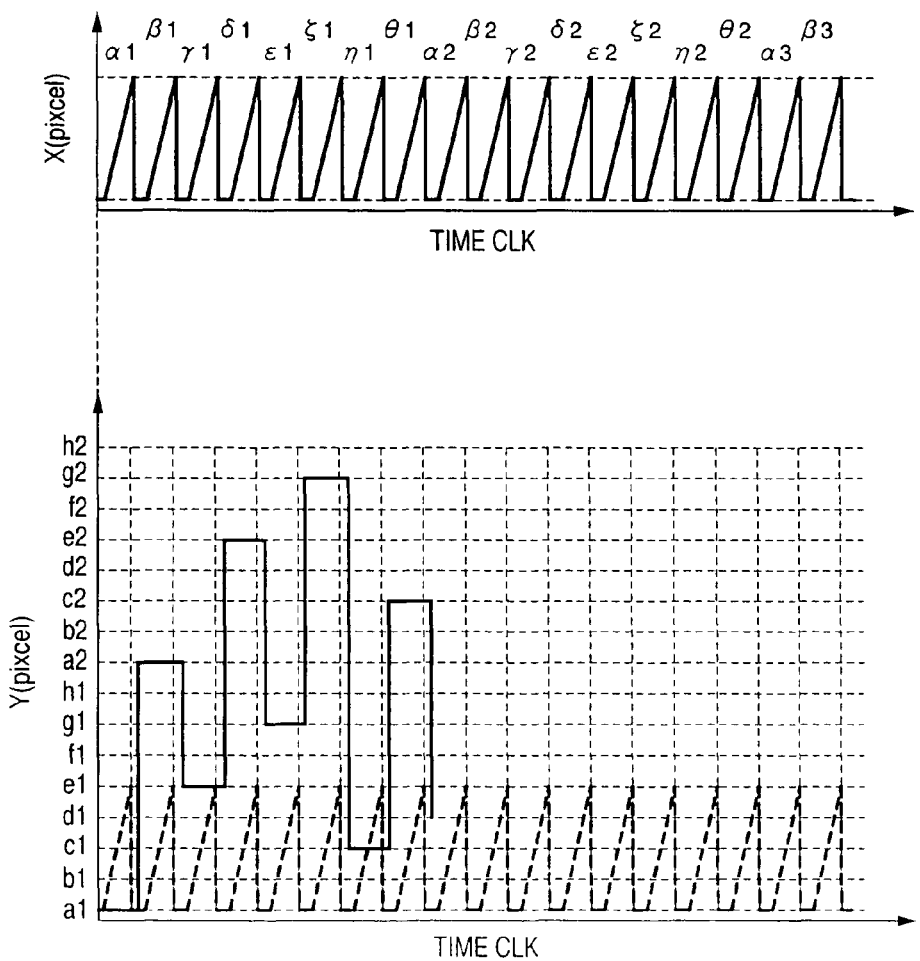
FIG. 8 is a diagram showing an example of a deflection pattern.

A deflection pattern C used when linking predetermined areas continuously to form one screen will now be described with reference to FIG. 8. FIG. 8 shows an example obtained when two areas are linked to form one screen.

In the present example, "a" and "e" lines located respectively in areas 1 and 2 are first scanned in order. In the present example, a1 is scanned in a period a1, and a2 is scanned in a period b1. Then e1 is scanned in a period c1, and e2 is scanned in a period d1.

Subsequently, two "g" lines are scanned extending over areas. And two "c" lines located between the already scanned "a" and "e" lines are scanned. And remaining scanning lines are scanned, and all scanning lines are scanned.

It becomes possible to mitigate the influence of the charging by setting a position that is located at the greatest distance from a plurality of scanning lines as the next scanning position on the basis of the previously scanned scanning position. Finally, two areas taken in are linked to form one screen.

Figure 9:
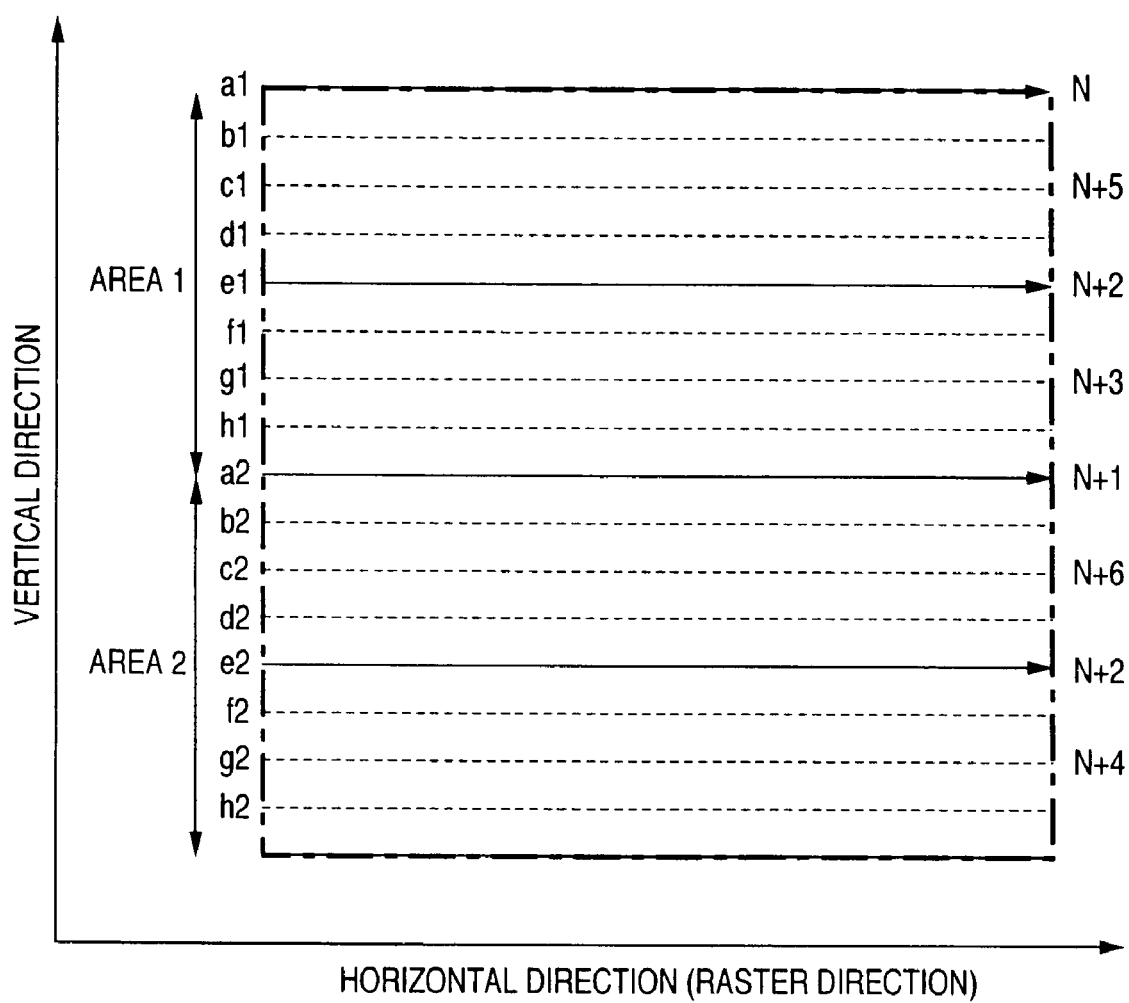
FIG. 9 is a diagram showing an example of a trajectory of a deflection pattern.

FIG. 9 shows an example of a trajectory obtained by scanning the sample 7 with the primary electron beam 2 according to the above-described deflection pattern C.

In the example shown in FIG. 9 as well, it is desirable to conduct the processing of repeating the process in which a center line between already scanned lines is scanned as the next scanning line as described with reference to the example shown in FIG. 5. In the present example, the example in which a scanning area is divided into two parts and processed has been described. However, this is not restrictive. For example, the area may be divided into four parts, eight parts, sixteen parts, thirty-two parts, or sixty-four parts. If the number of parts obtained by the division is too large, the effect of the present embodiment is decreased. Therefore, it is desirable to limit the number of parts to approximately sixty-four. The reason will now be described. If the number of scanning lines is too large, the next scanning line is scanned in the adjacent position in the state in which the influence of charging generated by the previous scanning line remains, resulting in inclination of charging. If scanning is conducted so as to produce a common scanning sequence every area produced by the division, it is possible to prevent the charging state from inclining every area. In addition, it is possible to provide the controller with a function of changing over the number of parts obtained by the division and change over the scanning pattern according to the changeover in the number of parts.

Figure 10:
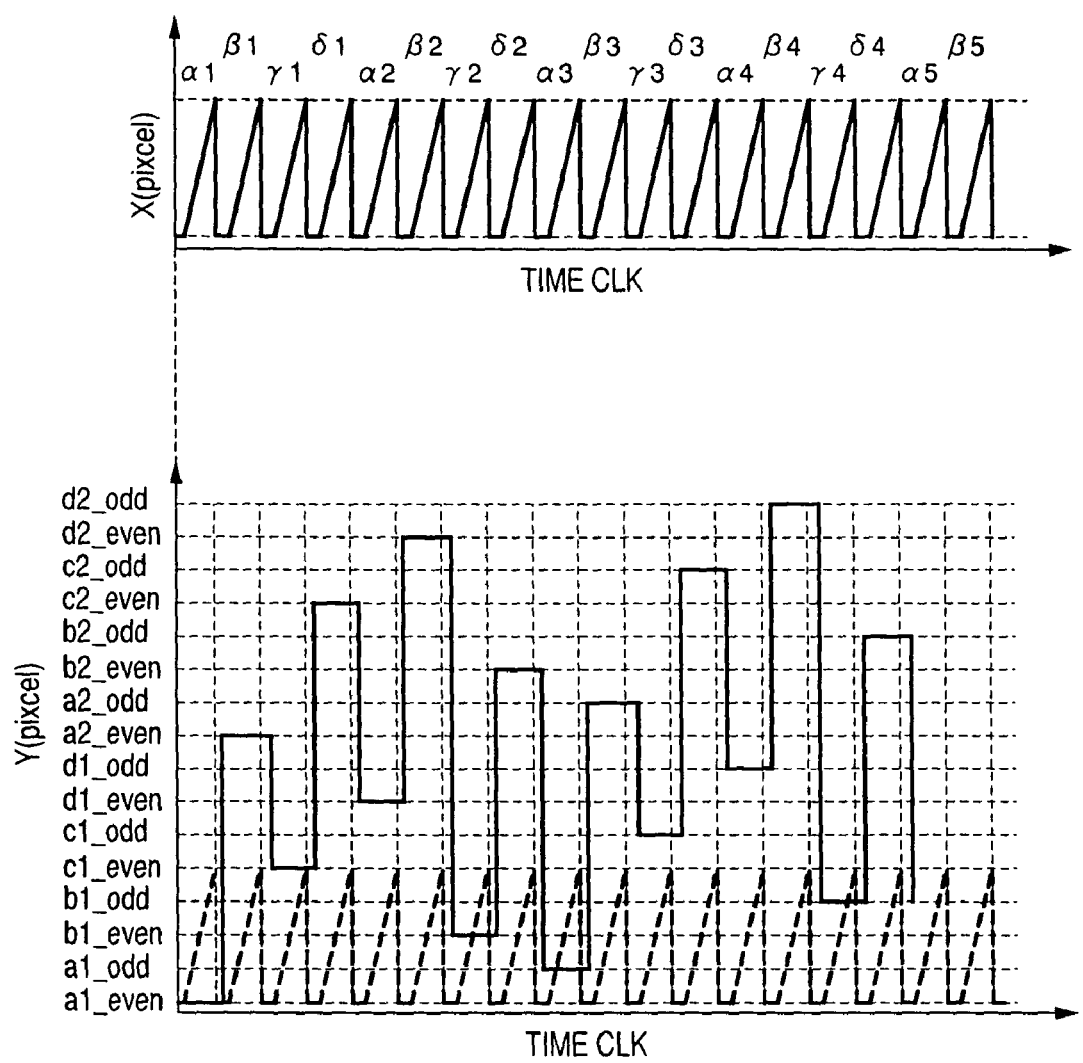
FIG. 10 is a diagram showing an example of a deflection pattern.

FIG. 10 shows an example obtained when the present invention is applied to the interlaced scanning. In the interlaced scanning, lines are selected alternately and scanned, and remaining lines are scanned at the next step. By the way, in the conventional TV scanning, the interlaced scanning is basically adopted. FIG. 10 shows the case where two areas construct a screen. In the present example, first, all lines of a_even located first in areas 1 to 2 are scanned in order. In FIG. 10, a1_even is scanned in a period a1 and a2_even is scanned in a period b1. Then c1_even is scanned in a period c1 and c2_even is scanned in a period d1.

Subsequently, extending over areas, c_even lines located between two already scanned a_even lines are scanned in the areas 1 to 2. In FIG. 10, c1_even is scanned in a period y1 and c2_even is scanned in a period δ1. Then d1_even is scanned in a period α2 and d2_even is scanned in a period β2.

Subsequently, d_even lines located between the already scanned c_even lines and a_even lines in the next area, and b_even lines located between the a_even lines and c_even lines are scanned in the same way. To this point, scanning corresponding to one field "even" in the interlaced scanning is finished.

Lines corresponding to "odd" located between lines alternately scanned in "even" are scanned one after another in periods α3 to δ4 in the order of a_odd→c_odd→d_odd→b_odd in the same way as "even." The remaining one field corresponding to "odd" is taken in.

Finally, one field in the "even" and one field in the "odd" are compounded to construct one screen.

Figure 11:
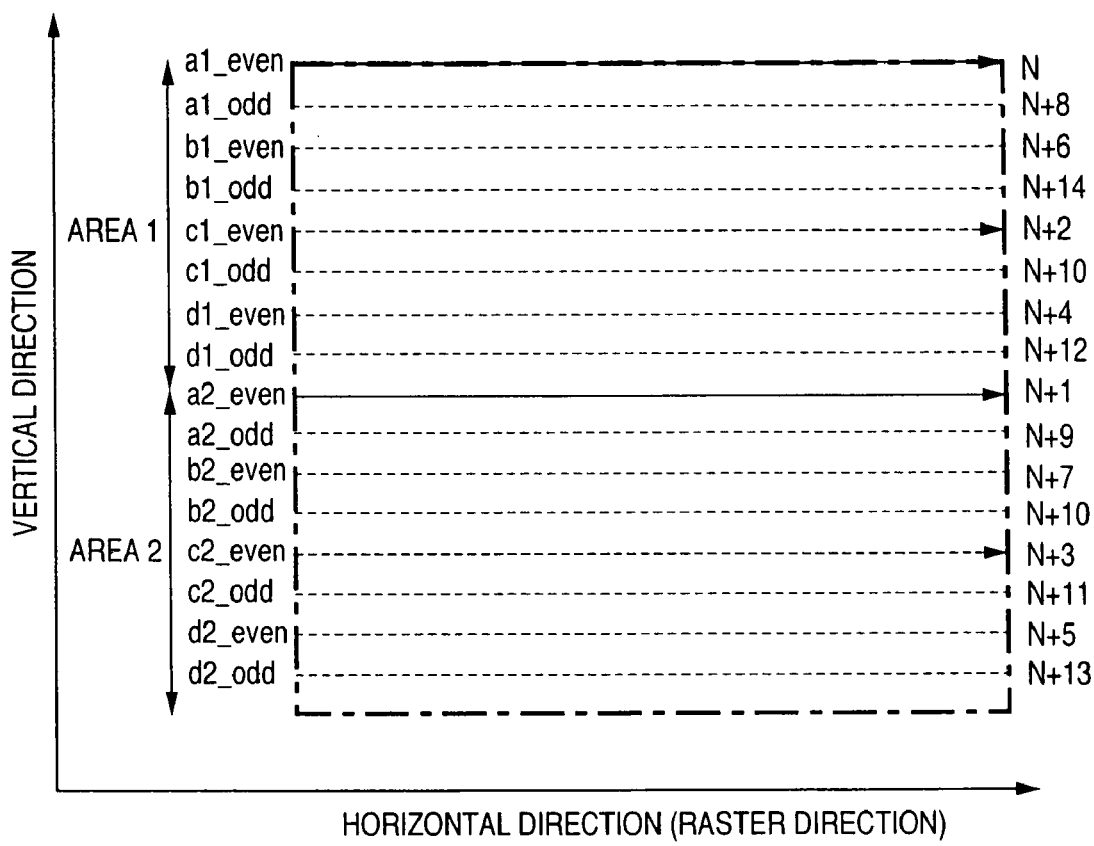
FIG. 11 is a diagram showing an example of a trajectory of a deflection pattern.

FIG. 11 shows an example of a trajectory obtained when the sample 7 is scanned with the primary electron line 2 in accordance with a deflection pattern D. For example, it is now assumed that one screen is formed of two areas as shown in FIG. 11. An Nth scan and an (N+1)-st scan are conducted respectively on a line a1_even and a line a2_even in the next area. Returning to the previous area, an (N+2)-nd scan is conducted on a line c1_even. An (N+3)-rd scan is conducted on a line c2_even in the next area again. Hereafter, scans are conducted on lines corresponding to "even" in the interlaced scanning until an (N+7)-th scan on a line b2_even. After the scans corresponding to "even" lines in the interlaced scanning have been finished, (N+8)-th to (N+15)-th scans are conducted on lines corresponding to "odd" in the same way.

Figure 12:
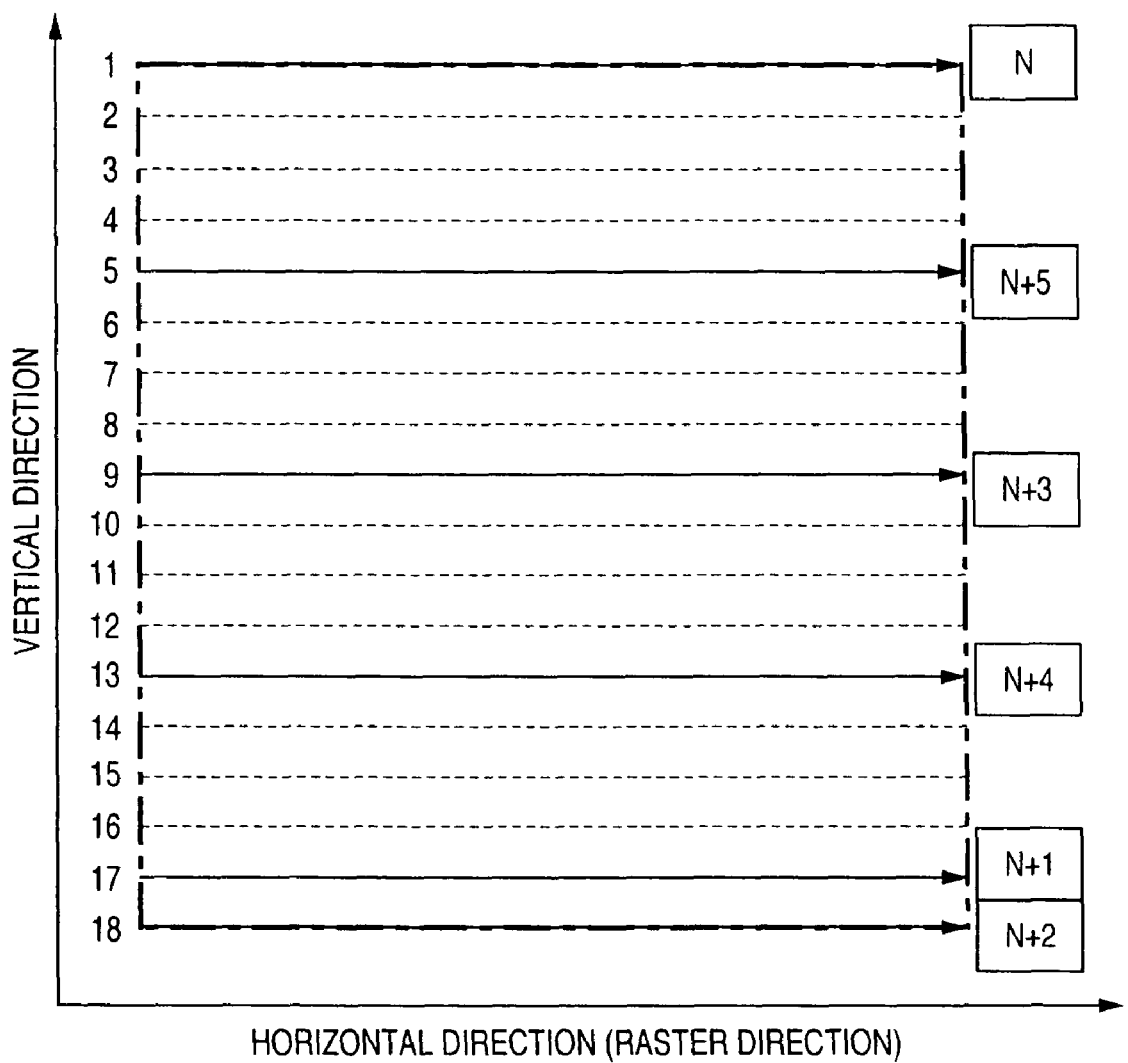
FIG. 12 is a diagram showing an example of a trajectory of a deflection pattern.
Figure 13:
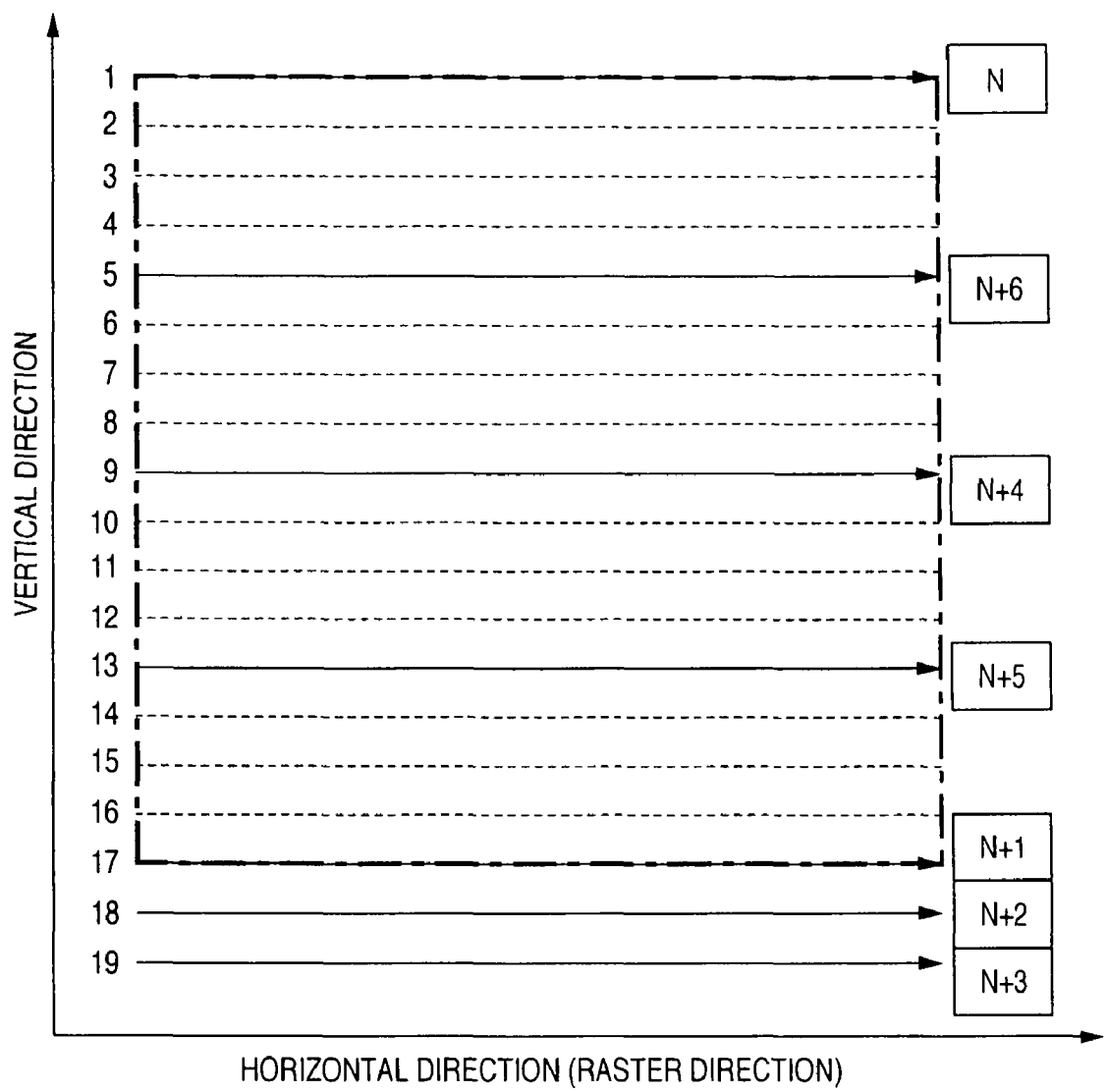
FIG. 13 is a diagram showing an example of a trajectory of a deflection pattern.
Figure 14:
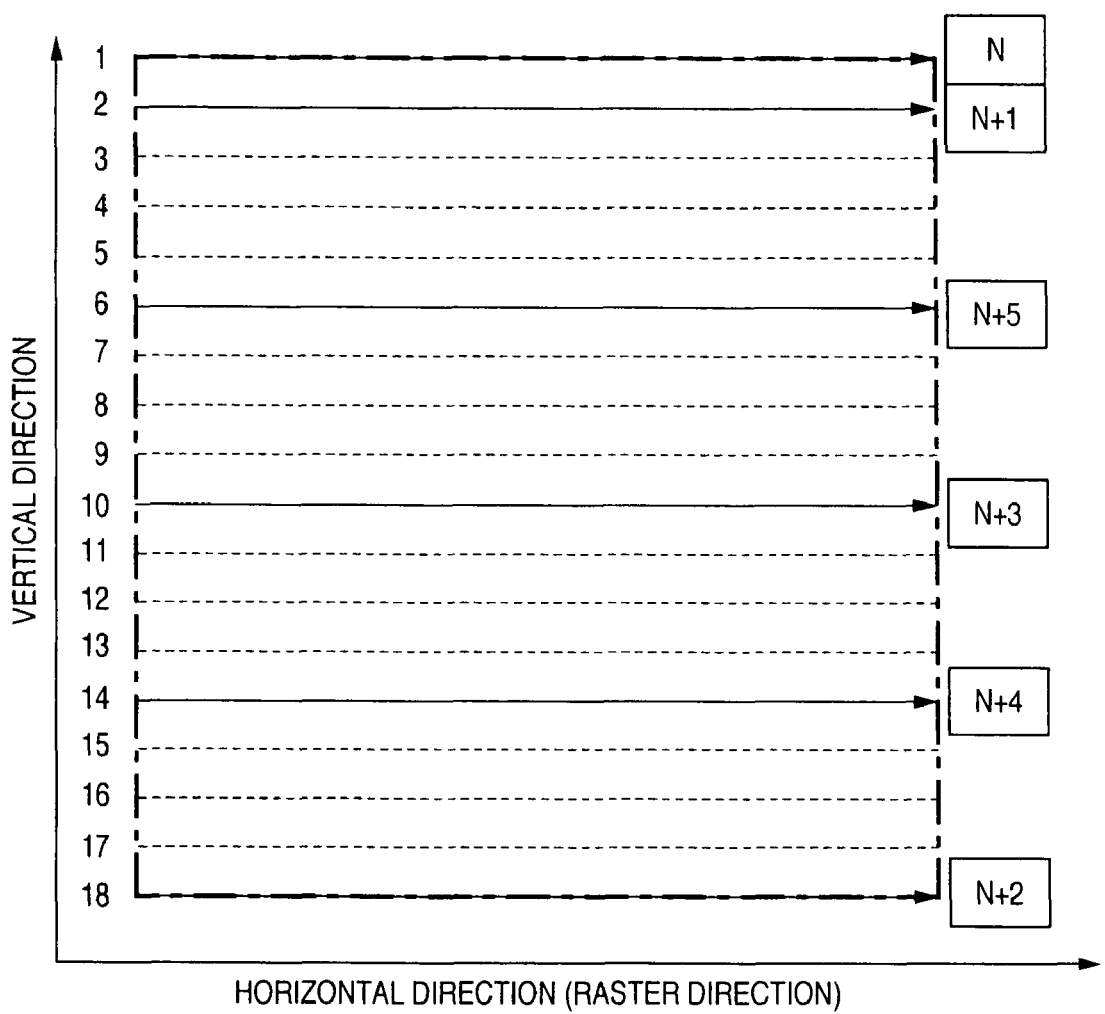
FIG. 14 is a diagram showing an example of a trajectory of a deflection pattern.

FIG. 12 shows an example in which only one line is exempted from the rule of the present embodiment and a scan is conducted on a screen end without taking a center line between two lines scanned earlier. Even if such scanning is conducted, there is no substantial change in the effect of the present invention. In other words, even if scans overlap at the screen end and partial inclination of charging occurs in the portion, the charging situation in a principal portion of the screen is not affected. Furthermore, even if two lines are added at the screen end instead of only one line as shown in FIG. 13, there is no change in the effect of the present invention. Furthermore, even if only one line is scanned not at the bottom end of the screen but at the top end as shown in FIG. 14 without taking a center line between two lines scanned earlier, there is no change in the effect of the present invention.

Second Embodiment

Figure 15:
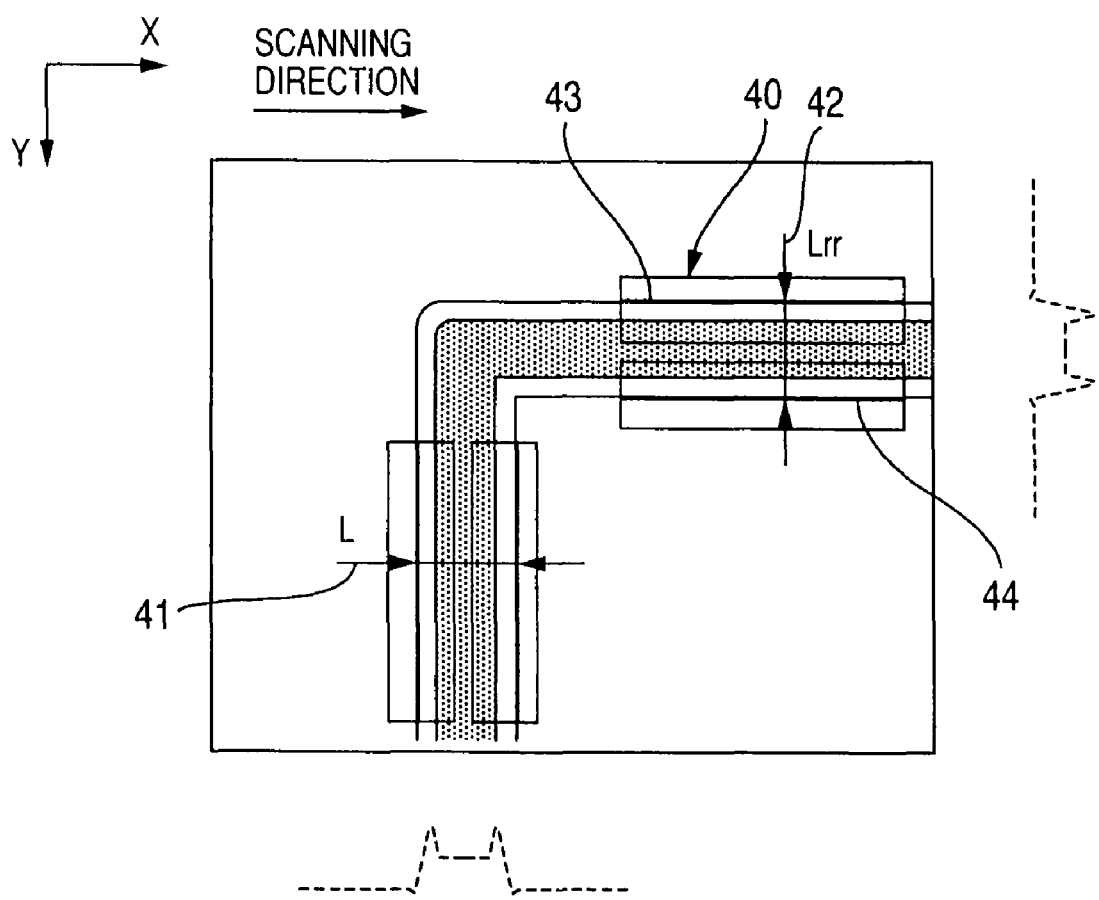
FIG. 15 is a diagram showing an example of an image formed using a scanning method.

An example in which pattern length measurement is conducted on the basis of an image formed using a scanning method of scanning a center line between scanning lines one after another as described above will now be described. FIG. 15 is a diagram showing an example of an image formed using the scanning method of the present example.

On this image, a line pattern bent in a part thereof by 90 degrees is displayed. When measuring the line width of such a line pattern, the scanning line direction of the raster scan and the sample direction are set in the conventional technique so as to make the pattern edge perpendicular to the scanning line direction of the raster scan. Because a length value measured in the scanning line direction of the raster scan becomes different from that measured in other directions as illustrated in FIG. 16 although the line width is the same. Since in this way the length value measured in the scanning line direction becomes different from that measured in other directions, there is a problem that the length value measured in a direction other than the scanning line direction cannot be ensured.

As cause of difference in measured length value or magnification between the scanning line direction (such as the X direction) and another direction (such as the Y direction), influence of charging is conceivable. If one scanning line is scanned and then scanning is conducted in an adjacent place, scanning using the electron beam is conducted at an interval different from the intended scanning line interval under the influence of charging in the previously scanned place. Therefore, it is considered that the magnification in the X direction and that in the Y direction do not have the relation of 1:1.

Such a problem is solved in the present example as follows. When scanning a two-dimensional area on the sample by using a plurality of scanning lines, a third scanning line is scanned between a first scanning line and a second scanning line, and then a plurality of scanning lines are scanned between the first scanning line and the second scanning line and between the second scanning line and the third scanning line. In addition, the length measurement direction can be set in a direction different from a scanning line direction of an image formed on the basis of the scanning.

Specifically, a length measurement range setting box 40 is provided as shown in FIG. 15 so as to be capable of setting the length measurement direction in a direction (which is a direction perpendicular to the scanning line direction in the case of the present example) different from the scanning line direction. Owing to the scanning specific to the present example, it is possible to suppress the magnification error caused between the scanning line direction and another direction (especially, a direction perpendicular to the scanning line direction). According to the present example, therefore, it becomes possible to measure the length accurately irrespective of the direction. This effect is demonstrated especially when measuring the length as shown in, for example, FIG. 15.

In the example shown in FIG. 15, two length measurement points 41 and 42 that are different in length measurement direction are present on one image. When conducting such length measurement, it is necessary in the conventional technique to change the scanning line direction every two length measurement points in order to ensure the length measurement precision. The present example has an effect that length measurement in a plurality of directions can be conducted at high precision on one screen. If the actual illustrated line pattern has the same line width, it is possible in the present example to square a line width L in the X direction with a line width Lrr in the Y direction with high precision irrespective of the scanning direction.

In addition, conducting the above-described scanning also brings about an effect that the length can be measured with high precision even if the scanning line direction is rotated and the scanning line direction is set to an arbitrary direction. It also becomes possible to maintain high length measurement precision irrespective of the scanning direction by rotating the scanning direction (i.e., conducting raster rotation) as described in FIG. 16.

By the way, the length measurement range setting box 40 can be displayed on the formed image, and positions of measurement reference positions 43 and 44 can be arbitrarily set. The measurement reference positions 43 and 44 can be set in arbitrary positions on the image by using, for example, a pointing device, which is not illustrated. The controller 15 is programmed so as to, for example, store the length measurement range setting box 40, count pixels between the measurement reference positions 43 and 44 in the length measurement range setting box 40, and measure the length between the measurement reference positions 43 and 44 on the basis of magnification set at that time.

Third Embodiment

Figure 17A:
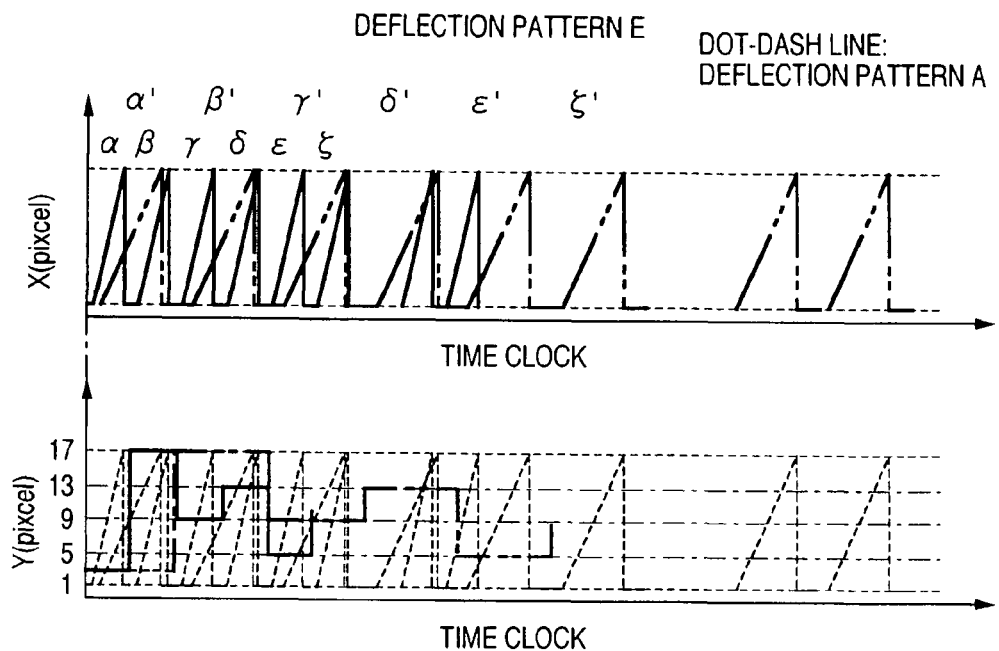
FIGS. 17A and 17B are diagrams showing examples of fast scanning.
Figure 17B:
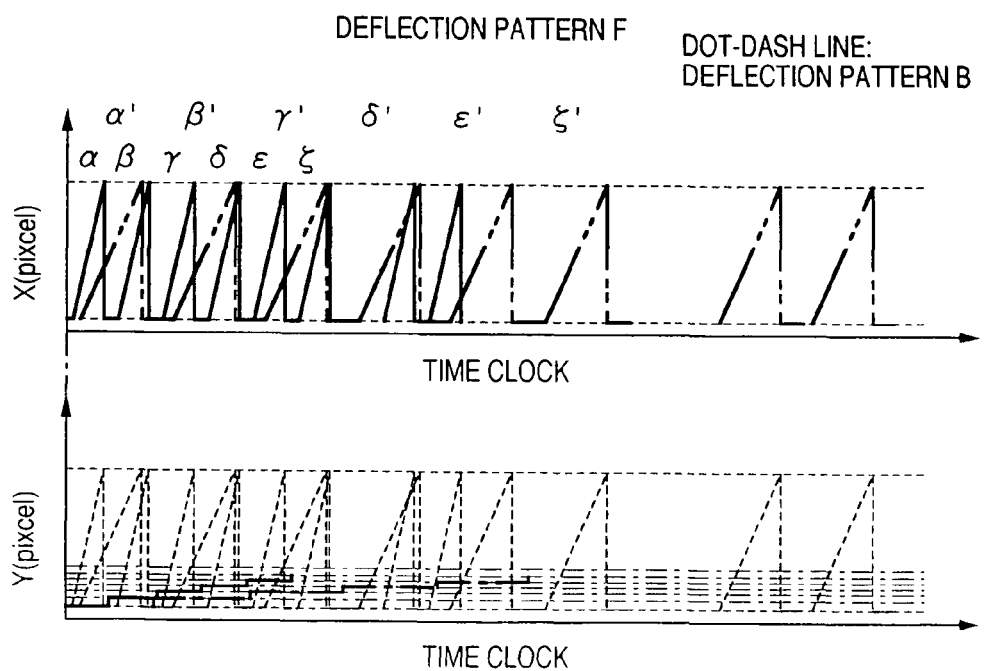

An example of further mitigating the influence of the charging by combining a faster scanning rate with the scanning method described with reference to the first embodiment will now be described. FIGS. 17A and 17B are diagrams showing deflection patterns (deflection patterns E and F represented by solid lines) used when scanning using the electron beam is conducted at a scanning rate that is twice with respect to the deflection patterns A and B described in the first embodiment. Observation and measurement become possible even for a sample affected by the charging more remarkably by combining the suppression of charging obtained using scanning faster than the ordinary scanning with the scanning method described with reference to the first embodiment.

Figure 22:
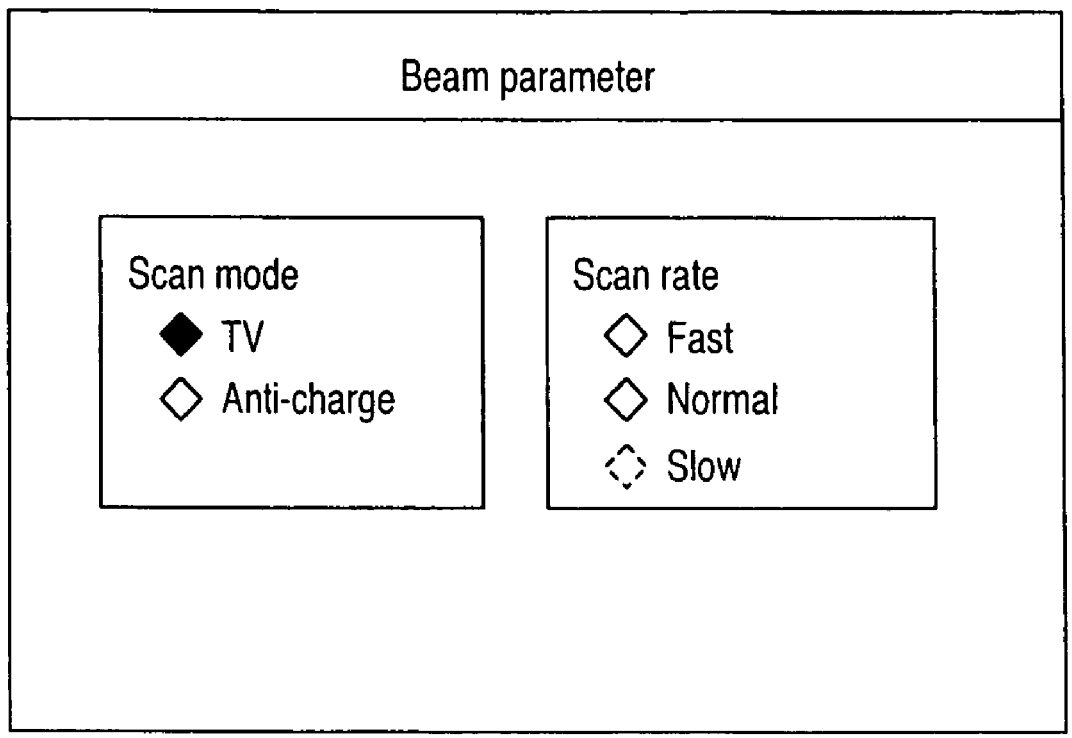
FIG. 22 is a diagram showing an example of a GUI screen for setting a scanning method.
Figure 23A:
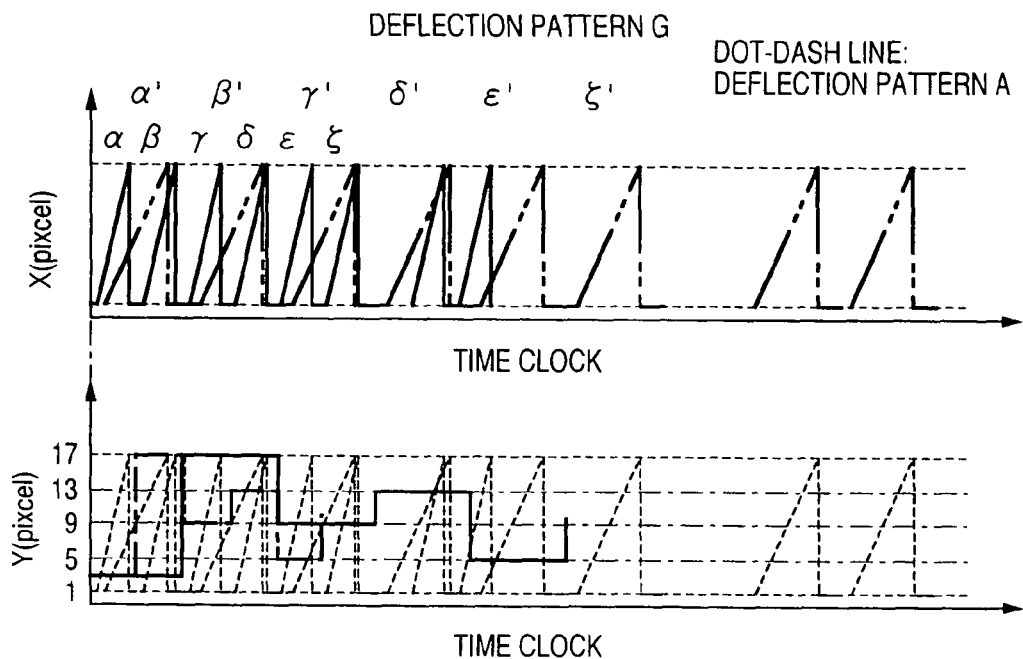
FIGS. 23A and 23B are diagrams showing examples of slow scanning.
Figure 23B:
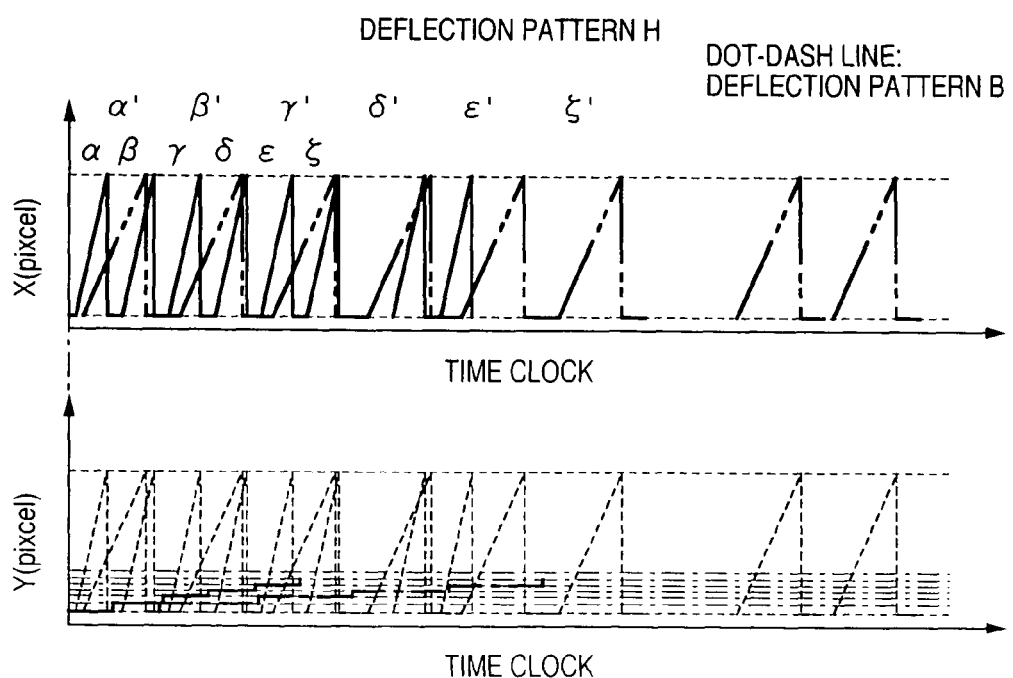

FIG. 22 is a diagram showing an example of a GUI (Graphical User Interface) for setting various scanning methods including the scanning method of the present example and the scanning rate. In a GUI screen shown in FIG. 22, a window for selecting an ordinary television scan or the scanning method described in the first embodiment (represented as "anti-charge" scan because it is a scanning method that is effective against charging) and a window for selecting a scanning rate (fast scanning, normal scanning, and slow scanning) are included. Here, the fast scanning refers to scanning conducted at the scanning rate as shown in FIGS. 17A and 17B (supposing that scanning conducted at the scanning rate as shown in FIGS. 3 and 4 is normal scanning). Scanning conducted at a scanning rate as shown in FIGS. 23A and 23B is slow scanning.

If the TV scan is selected, inhibition processing is conducted in the present example to prevent the slow scan from being selected. If the anti-charge scan is selected, it is allowed to select the slow scan. Since the scanning method described in the first embodiment is not susceptible to the influence of charging, scanning can be conducted at a relatively slow rate as compared with the TV scan.

Therefore, the slow scan is made selectable when the scanning method described in the first embodiment is selected, whereas the slow scan is not made selectable when the scanning method described in the first embodiment is not selected. When scanning a sample that is easily affected by the charging, this prevents a combination of the scanning method that stores charging on the sample (TV scan) with the slow scan that stores charging on the sample (a deflection pattern H) from being falsely selected.

If the TV scan is selected and then the fast scan, the normal scan or the slow scan is selected, the deflection pattern F, the deflection pattern B or the deflection pattern H is selected in the present example, respectively. If the anti-charge scan is selected and then the fast scan, the normal scan or the slow scan is selected, then the deflection pattern E, the deflection pattern A or the deflection pattern G is selected, respectively.

As heretofore described, the influence of charging on the sample differs depending upon the scanning method with the electron beam. By changing the setting range of selectable parameters concerning the electron beam according to the scanning method, therefore, it becomes possible to set arbitrary parameters without considering the influence of charging. In the present example, the setting parameters are the scanning method and the scanning rate. However, this is not restrictive. It is also possible to set the kind of the sample that differs in influence of charging as a part of the setting parameters. At this time, it is conceivable to conduct inhibition processing, such as preventing the slow scan from being selected or preventing the raster scan from being selected, when a sample kind that is easily affected by the charging is selected. Furthermore, the beam current and magnification can become a part of the setting parameters. In the present example, desired setting can be conducted using a pointing device which is not illustrated. The parameters set on the GUI screen shown in FIG. 22 are sent to the controller 15, and converted to control signals for the deflectors.

Fourth Embodiment

In the pre-charging technique, the sample surface is charged previously by applying an electron beam, and scanning is conducted with an electron beam for forming an image under the charged state. An example in which the above-described scanning method is applied to the pre-charging technique will now be described.

Figure 18:
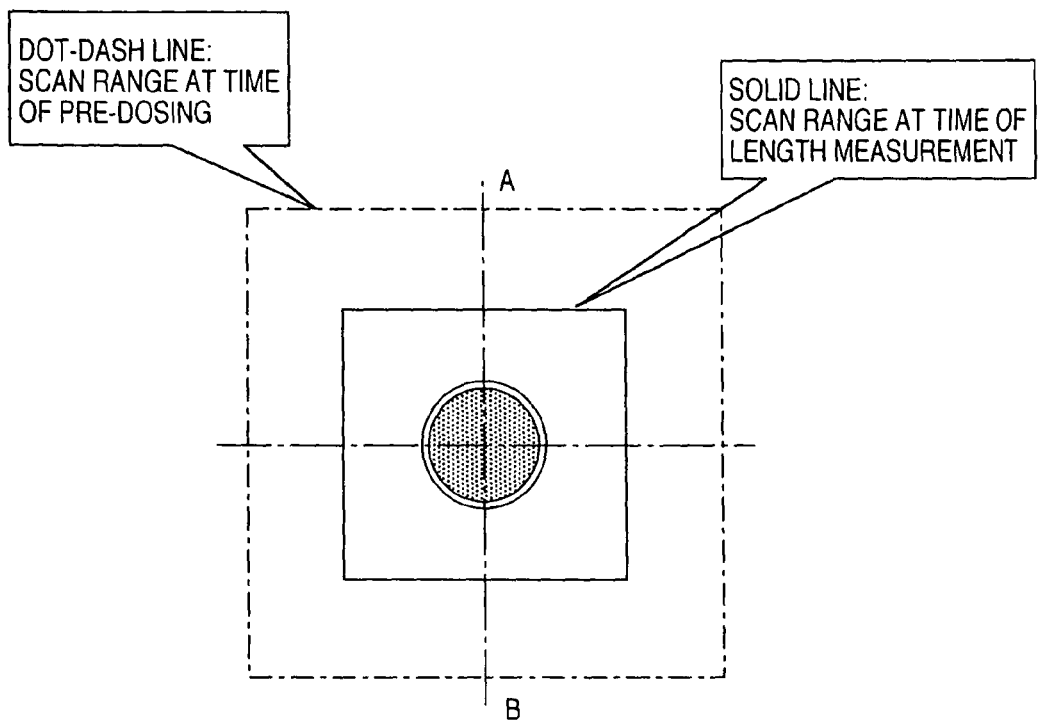
FIG. 18 is a schematic diagram showing a preliminary charging technique.

FIG. 18 is a schematic diagram showing the pre-charging technique (pre-dose). The pre-charging technique is a technique of charging the sample surface positively by electron beam irradiation in order to pull up electrons from, for example, the bottom of a contact hole of a semiconductor device. It becomes possible to pull up secondary electrons efficiently from the bottom of the contact hole by applying the electron beam for forming an image under the positive charging state. For that purpose, scanning with an electron beam for previously charging the sample surface is conducted before scanning with an electron beam for forming an image is executed. Such a pre-charging technique is described in JP-A-5-151927 (corresponding to U.S. Pat. No. 5,412,209) and JP-A-2000-200579 (corresponding to U.S. Pat. No. 6,635,873).

In this example, it is proposed to use a scanning method of scanning a third scanning line between a first scanning line and a second scanning line, and then scanning a plurality of scanning lines between the first scanning line and the second scanning line and between the second scanning line and the third scanning line, as the scanning for the pre-charging. The pre-charging scanning aims at charging the sample surface. The prime object of the pre-charging scanning is to detect secondary electrons from the bottom of the stable contact hole with high efficiency by sustaining the charged state. If charging is conducted with inclination, therefore, a bad influence is exerted on the scanning for forming an image over a long time.

In view of such circumstances, in the present example, the pre-charging scanning as described above is conducted and then the scanning for forming the image is conducted. By thus conducting the scanning, it becomes possible to form a stable charging state having no inclination. In the example described with reference to FIG. 18, magnification in the pre-charging scanning is made lower than that for forming the image. However, this is not restrictive. It is also possible to conduct the pre-charging scanning by scanning the sample surface with an electron beam having arrival energy with a secondary electron emission efficiency $\delta > 1$.

Figure 19:
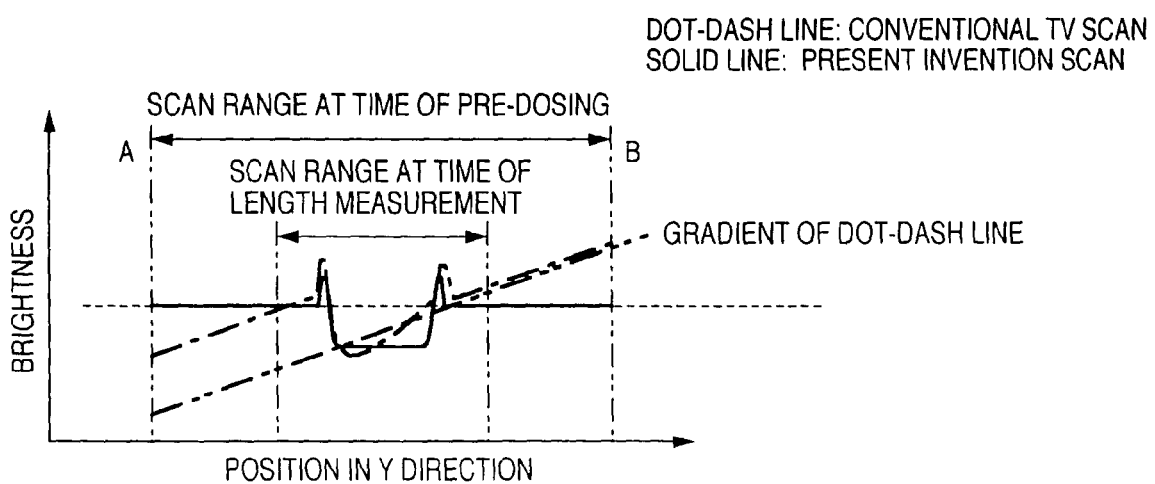
FIG. 19 is a diagram showing brightness changes in the Y scanning direction obtained under different scanning methods.

FIG. 19 is a diagram showing a change of brightness in the Y scanning direction obtained when the pre-charging scanning is conducted using the ordinary TV scan and when the pre-charging scanning is conducted using the scanning method in the present example. A dot-dash line represents a change of image brightness obtained when the TV scan is conducted. In the ordinary scanning, the next scanning line is scanned in the vicinity of a scanning line, and this is repeated. As the position moves from the top of the image to the bottom, therefore, charging is gradually accumulated. Since the top of the image is thus different in charging state from the bottom, the top differs in brightness from the bottom.

If scanning for measurement is conducted in such a state, a line profile representing a change of the detected electron quantity and pixel brightness becomes as represented by the dot-dash line in FIG. 19 under the influence of inclined charging formed at the time of pre-charging. On the other hand, if the pre-charging is conducted using the scanning method of the present example, the charging state is stable irrespective of the position in the Y direction. Therefore, it becomes possible to form a proper line profile that represents the shape of the sample surface.

Fifth Embodiment

Figure 20:
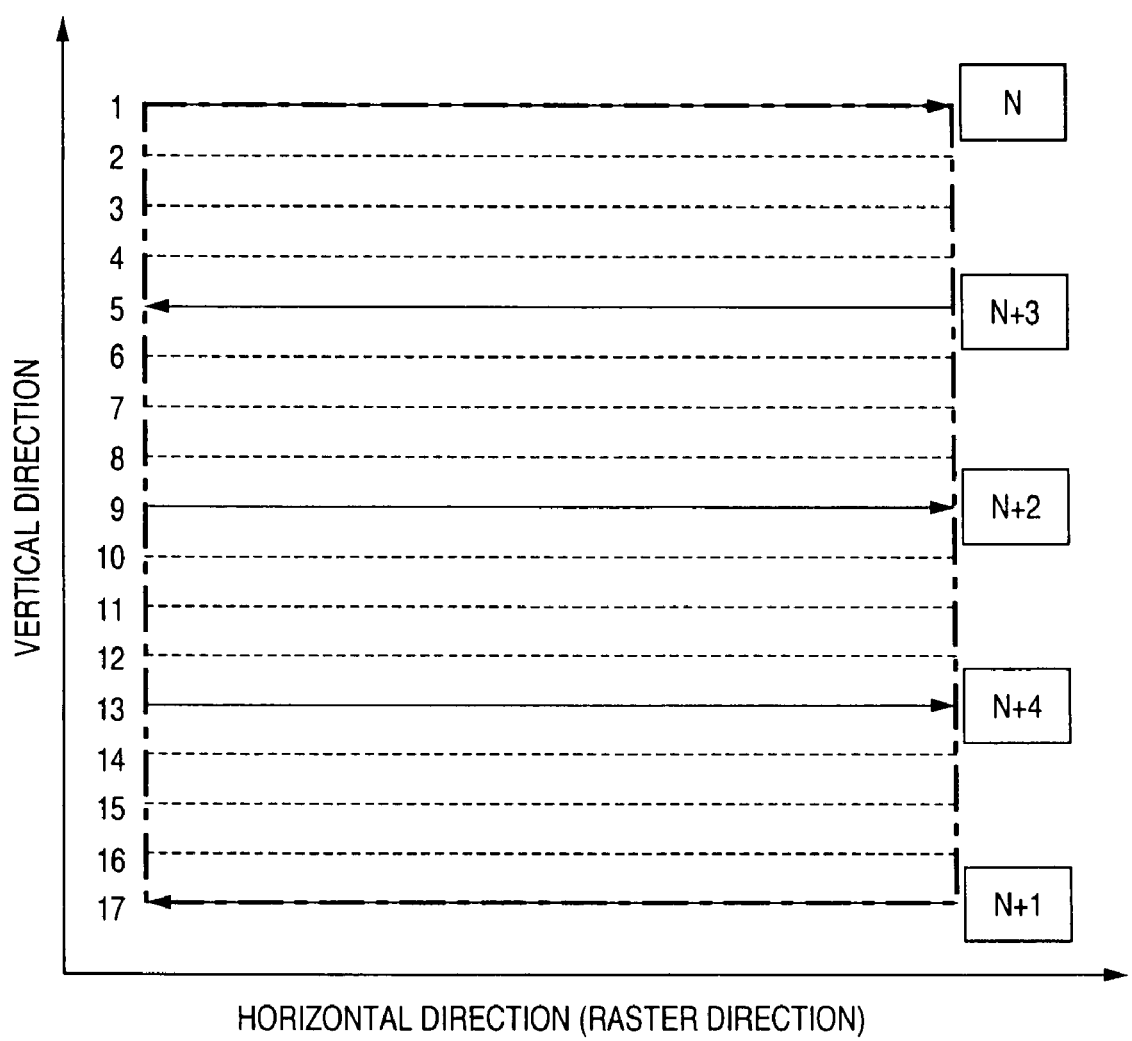
FIG. 20 is a diagram showing scanning in the X direction conducted alternately in opposite directions.

FIG. 20 shows a scanning method obtained by further improving the scanning method described in the first embodiment. Scanning in the X direction is conducted alternately in opposite directions. That is, the line 1 is first scanned from the left side in FIG. 20 to the right side. Subsequently, the line 17 is scanned from the right side in FIG. 20 to the left side. Even if the sample is a sample on which charging is inclined depending upon the scanning direction and the influence of charging is accumulated, it becomes possible to form a sample image having high horizontal uniformity irrespective of the influence of charging, by thus changing the scanning direction every scanning line.

Sixth embodiment

Figure 21:
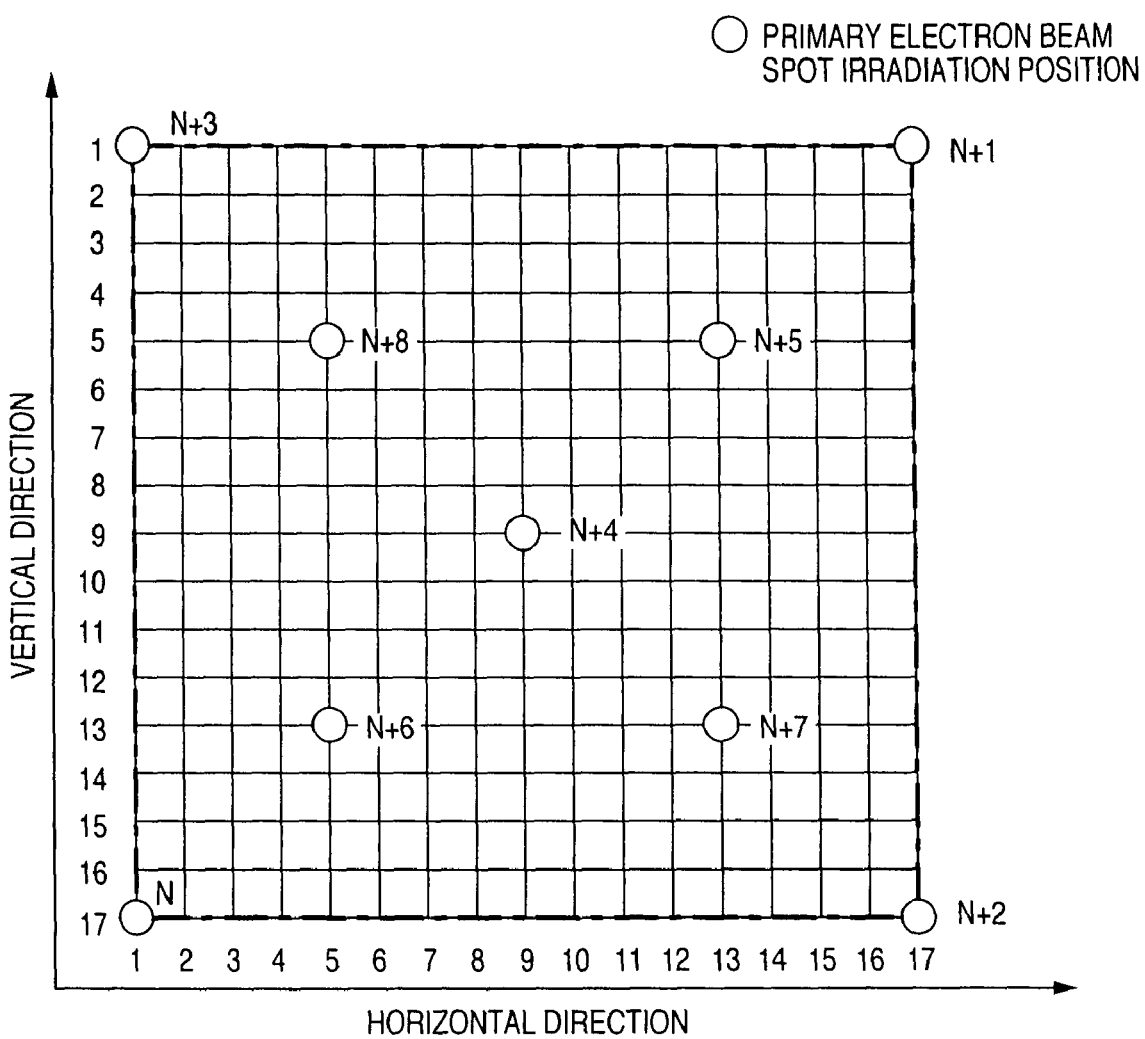
FIG. 21 is a diagram showing scanning of a two-dimensional area with a pulse beam.

FIG. 21 is a diagram showing an example in which the scanning method of scanning the next scanning line located on a center line between already scanned scanning line trajectories described in the first embodiment is developed two-dimensionally. In the case of the present example, first, an electron beam (N) (pulse beam) is applied to coordinates (17, 1) on a corner of a two-dimensional irradiation area in a spot form. Subsequently, an electron beam (N+1) is applied to coordinates (1, 17), which is at the longest distance from the coordinates (17, 1) in the scanning subject area. Subsequently, electron beams (N+3 and N+2) are applied to coordinates (1, 1) and coordinates (17, 17), which are located between the coordinates (1, 17) and the coordinates (17, 1) and which are at the longest distance from the coordinates (1, 1) and coordinates (17, 17). Thereafter, an electron beam (N+4) is applied to the center (9, 9) among irradiation positions to which the electron beams have been applied. In addition, electron beams (N+5, N+6, N+7, and N+8) are applied to centers among irradiation positions to which the electron beams have been applied. In addition, thereafter, applying electron beams to centers among irradiation positions to which the electron beams have been applied is repeated. As a result, irradiation over the entire scanning area is completed.

By the way, the above-described scanning sequence is nothing but an example. For example, after the electron beam (N+4) has been applied, the next irradiation point may be set to a center of each of sides prescribing the two-dimensional irradiation area, such as coordinates (9, 17) between the coordinates (1, 17) and the coordinates (17, 17). It is desirable to position the next irradiation point on a center between two previous irradiation points and set the next irradiation point in a position that is at the longest distance from a point of last irradiation and a point of last irradiation but one, or a position close to the position. After beam irradiation to center positions having equal intervals between irradiation positions on coordinates has been finished, preferably the next irradiation positions are set to center positions having narrower intervals between irradiation positions, and the intervals between irradiation positions are gradually narrowed.

By repeating deflections that position the next irradiation positions on the centers among already irradiated irradiation positions, irradiation over all coordinates spreading two-dimensionally is completed.

By the way, even if an electron beam is applied in a pulse form as heretofore described, an image of a two-dimensional area on the sample can be formed by synchronizing the signal supplied to the scanning deflector with the deflection signals of the display device in the same way as the ordinary scanning electron microscope. When moving the beam between irradiation points, it becomes possible to selectively apply the electron beam to a desired irradiation position by diverting the trajectory of the electron beam from the sample with, for example, a deflector for blanking so as to prevent the electron beam from being applied to the sample.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An image forming method for scanning a two-dimensional area on a sample with a charged particle beam and forming an image of the scanned area, the image forming method comprising the steps of:
   scanning a first scanning line;
   scanning a second scanning line;
   scanning a third scanning line between the first scanning line and the second scanning line;
   scanning an area having two sections, defined by the first, second, and third scanning lines, by sequentially scanning positions between the first and third scanning lines and scanning positions between the third and second scanning lines so as to reduce the area in stages; and
   repeatedly scanning for a center by scanning lines between the first scanning line and the third scanning line, and scanning lines between the third scanning line and the second scanning line until scanning of the two-dimensional area is complete.

2. An image forming method according to claim 1, wherein said third scanning line is disposed at equidistance from said first and second scanning lines.

3. An image forming method according to claim 1, wherein scanning line disposed at the center of said plurality of scanning lines is a fourth scanning line which is scanned next to said third scanning line.

4. An image forming method according to claim 1, wherein said first and second scanning lines are disposed at the edge of said two-dimensional area or a part of area of said two-dimensional area.

5. A charged particle beam apparatus including a deflector for scanning charged particle beam on a sample and a control apparatus for controlling said deflector, wherein:
   said control apparatus controls said deflector to:
   scan a first scanning line and second scanning line on a two-dimensional area on said sample;
   scan a third scanning line between said first and second scanning lines;
   scanning an area having two sections, defined by the first second, and third scanning lines, by sequentially scanning positions between the first and third scanning lines and scanning positions between the third and second scanning lines so as to reduce the area in stages; and
   repeatedly scanning for a center by scanning lines between the first scanning line and the third scanning line, and scanning lines between the third scanning line and the second scanning line until scanning of the two-dimensional area is complete.

6. A charged particle beam scanning apparatus according to claim 5, wherein:
   said control apparatus controls said deflector such that positioning said third scanning line at equidistance to said first and second scanning lines.

7. A charged particle beam apparatus according to claim 5, wherein:
   said control apparatus renders scanning line disposed at center of said plurality of scanning lines as a fourth scanning line which is scanned next to said third scanning line.

8. A charged particle beam apparatus according to claim 5, wherein:
   said control apparatus positions said first and second scanning lines at an edge of said two-dimensional are or part of area of said two-dimensional area.

9. A charged particle beam apparatus according to claim 5, wherein:
   said control apparatus controls said deflector such that structuring said two-dimensional are on said sample as a single or divided plural areas, and scanning said first, second and third scanning lines at each area.

10. A charged particle beam apparatus according to claim 9, wherein:
    said two-dimensional area is divided into any one of two parts, four parts, eight parts, sixteen parts, thirty-two parts and sixty-four parts.

11. An image forming method for scanning a two-dimensional area on a sample with a charged particle beam and forming an image of scanning area, the image forming method comprising the steps of:
    scanning a first scanning line at upper portion of said two-dimensional area on said sample, a second scanning line at lower part, and third scanning line between said first and second scanning lines and at the center of said two-dimensional area; and
    then, further scans scanning lines between said first and third scanning lines and between said second and third scanning lines,
    wherein said further scanning of said scanning lines repeat scanning of new scanning lines at a center of scanning lines which already scanned, such that narrowing distance between said scanning lines already scanned and scanning lines newly scanned, and
    wherein scanning is repeatedly performed for a center by scanning between the first scanning line and the third scanning line, and scanning lines between the third scanning line and the second scanning line until scanning of the two-dimensional area is complete.

12. An image forming method according to claim 11, wherein:
    said scanning of said new scanning lines scans scanning line newly for narrowing distance of scanning lines which is already scanned, after scanning at the center between scanning lines haying a same scanning line distance is said two-dimensional area.

13. An image forming method according to claim 11, wherein:
    said second scanning line scans at far most position from said first scanning line in said two-dimensional area.

14. A charged particle beam apparatus including deflector for scanning charged particle beam on a specimen and a control apparatus for controlling said deflector, wherein:
    said control apparatus scans a first scanning line at an upper portion of two-dimensional area on said specimen scans, a second scanning line at a lower part of said two-dimensional area, scans a third scanning line at the center of said two-dimensional area, and scans scanning lines between said first and said third scanning lines, and between said second and said third scanning lines,
    wherein said further scanning of said scanning lines controls said deflector such that repeat scanning of new scanning lines at a center of scanning lines which already scanned, and narrowing distance between said scanning lines already scanned and scanning lines newly scanned, and wherein scanning is repeatedly performed for a center by scanning between the first scanning line and the third scanning line, and scanning lines between the third scanning line and the second scanning line until scanning of the two-dimensional area is complete.

15. A charged particle beam apparatus according to claim 14, wherein:

said control apparatus controls said deflector such that scans said new scanning lines for narrowing distance of scanning lines already scanned, after scanning at the center of scanning lines having a same scanning line distance in said two-dimensional area.

16. A charged particle beam apparatus according to claim 14, wherein:

said control apparatus controls said deflector such that said second scanning line is scanned at far most position from said first scanning line in said two-dimensional area.

17. A pattern dimension measurement method for scanning two-dimensional area on a specimen with a charged particle beam and for forming an image of scanning area, and measuring dimension of pattern formed on said specimen based on said image, said method comprising steps of:

as said two-dimensional area of said specimen, scanning a first and second scanning lines and scanning a third scanning line between said first and second scanning lines, then, scanning a plurality of scanning lines between said first and third and scanning lines and between said second and third scanning lines so that forming image of said two-dimensional area, and measuring said pattern by setting measuring direction in a different direction of line direction of each scanning lines on said image;

scanning an area having two sections, defined by the first, second, and third scanning lines, by sequentially scanning positions between the first and third scanning lines and scanning positions between the third and second scanning lines so as to reduce the area in stages; and repeatedly scanning for a center by scanning lines between the first scanning line and the third scanning line, and scanning lines between the third scanning line and the second scanning line until scanning of the two-dimensional area is complete.

18. An image forming method for scanning a two-dimensional area on a sample with a charged particle beam and forming an image of scanning area, the image forming method comprising the steps of:

as to area including two-dimensional area in said sample, scanning a first and second scanning lines, scanning a third scanning line between said first and second scanning lines, then, by scanning a plurality of scanning lines between said first and third scanning lines, between second and third scanning lines, rendering to charge area including two-dimensional area of said sample, forming an image of said scanning area by scanning said charged particle beam onto said charged two-dimensional area, scanning an area having two sections, defined by the first, second, and third scanning lines, by sequentially scanning positions between the first and third scanning lines and scanning positions between the third and second scanning lines so as to reduce the area in stages; and repeatedly scanning for a center by scanning lines between the first scanning line and the third scanning line, and scanning lines between the third scanning line and the second scanning line until scanning of the two-dimensional area is complete.

19. A charged particle beam apparatus for deflecting charged particle beam irradiated on a specimen in a spot like shape, a deflector, and control apparatus for controlling said deflector, wherein:

said control apparatus controls said deflector such that deflects said charged particle beam so that said charged particle beam is irradiated at a first irradiating position positioned at four corners of said two-dimensional area on said specimen, then deflects said charged particle beam so that a second irradiating position is positioned at the center of said first irradiating positions, then scans an area having two sections, defined by a first scanning line, a second scanning line, and a third scanning line between the first and second scanning lines, by sequentially scanning positions between the first and third scanning lines and scanning positions between the third and second scanning lines so as to reduce the area in stages, and repeatedly scans for a center by scanning lines between the first scanning line and the third scanning line, and scanning lines between the third scanning line and the second scanning line until scanning of the two-dimensional area is complete.

* * * * *